(12) United States Patent
Cho et al.

(10) Patent No.: US 10,177,164 B2
(45) Date of Patent: Jan. 8, 2019

(54) SEMICONDUCTOR DEVICE

(71) Applicant: Samsung Electronics Co., Ltd., Suwon-si, Gyeonggi-do (KR)

(72) Inventors: Sunghan Cho, Seoul (KR); Shinhwan Kang, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/832,756

(22) Filed: Dec. 5, 2017

(65) Prior Publication Data
US 2018/0308856 A1 Oct. 25, 2018

(30) Foreign Application Priority Data
Apr. 24, 2017 (KR) .................. 10-2017-0052500

(51) Int. Cl.
| H01L 27/115 | (2017.01) |
| H01L 27/11565 | (2017.01) |
| H01L 23/532 | (2006.01) |
| H01L 23/528 | (2006.01) |
| H01L 27/11556 | (2017.01) |
| H01L 27/11519 | (2017.01) |
| H01L 27/11582 | (2017.01) |
| H01L 23/522 | (2006.01) |
| H01L 29/08 | (2006.01) |

(52) U.S. Cl.
CPC .... *H01L 27/11565* (2013.01); *H01L 23/5226* (2013.01); *H01L 23/5283* (2013.01); *H01L 23/53271* (2013.01); *H01L 27/11519* (2013.01); *H01L 27/11556* (2013.01); *H01L 27/11582* (2013.01); *H01L 29/0847* (2013.01)

(58) Field of Classification Search
CPC .......... H01L 27/11575; H01L 27/1157; H01L 27/11517; H01L 27/11526; H01L 27/11548; H01L 27/11556; H01L 27/11565; H01L 27/11573; H01L 29/34; H01L 27/11551

See application file for complete search history.

(56) References Cited

U.S. PATENT DOCUMENTS

| 8,349,689 B2 | 1/2013 | Lee et al. |
| 8,735,965 B2 | 5/2014 | Ishihara et al. |
| 8,822,971 B2 | 9/2014 | Park et al. |
| 8,829,589 B2 | 9/2014 | Lee et al. |
| 9,449,982 B2 | 9/2016 | Lu et al. |

(Continued)

FOREIGN PATENT DOCUMENTS

KR 20180000656 A 1/2018

*Primary Examiner* — Galina Yushina
(74) *Attorney, Agent, or Firm* — Renaissance IP Law Group LLP

(57) ABSTRACT

A stack structure including a plurality of gate electrodes is vertically stacked on a substrate and extends in a first direction. A channel structure includes vertical channels penetrating the stack structure and a horizontal channel connecting the vertical channels. The horizontal channel are provided under the stack structure. First lower wiring patterns are disposed between the substrate and the stack structure and electrically connected to the channel structure. Each first lower wiring pattern includes a first portion and a second portion having different widths from each other in the first direction.

20 Claims, 35 Drawing Sheets

(56) References Cited

U.S. PATENT DOCUMENTS

| | | | |
|---|---|---|---|
| 9,508,738 B2 | 11/2016 | Lee et al. | |
| 9,515,087 B2 | 12/2016 | Son et al. | |
| 9,570,462 B2 | 2/2017 | Lee et al. | |
| 9,620,712 B2 | 4/2017 | Hayashi et al. | |
| 9,960,173 B2* | 5/2018 | Shimojo | H01L 27/11519 |
| 2011/0291176 A1 | 12/2011 | Lee et al. | |
| 2013/0069139 A1 | 3/2013 | Ishihara et al. | |
| 2013/0134377 A1 | 5/2013 | Park et al. | |
| 2013/0140623 A1 | 6/2013 | Lee et al. | |
| 2015/0294978 A1 | 10/2015 | Lu et al. | |
| 2015/0325588 A1 | 11/2015 | Lee et al. | |
| 2016/0005762 A1* | 1/2016 | Lue | G11C 11/5671 |
| | | | 365/185.03 |
| 2016/0118399 A1* | 4/2016 | Son | G11O 5/025 |
| | | | 365/185.18 |
| 2016/0126455 A1 | 5/2016 | Hayashi et al. | |
| 2016/0190155 A1 | 6/2016 | Lee et al. | |
| 2017/0047342 A1* | 2/2017 | Hwang | H01L 27/11582 |
| 2017/0365616 A1* | 12/2017 | Kang | H01L 21/76816 |

\* cited by examiner

US 10,177,164 B2

SEMICONDUCTOR DEVICE

CROSS-REFERENCE TO RELATED APPLICATION

This application claims priority under 35 U.S.C § 119 to Korean Patent Application No. 10-2017-0052500 filed on Apr. 24, 2017 in the Korean Intellectual Property Office, the disclosure of which is incorporated by reference herein in its entirety.

TECHNICAL FIELD

The present inventive concept relates to a semiconductor device.

DISCUSSION OF RELATED ART

Semiconductor devices have been highly integrated for high performance and low manufacturing costs. Three-dimensional semiconductor devices have been proposed for higher integration of memory cells at lower costs.

SUMMARY

According to an exemplary embodiment of the present inventive concept, a semiconductor device is provided as follows. A stack structure including a plurality of gate electrodes is vertically stacked on a substrate and extends in a first direction. A channel structure includes a plurality of vertical channels penetrating the stack structure and a horizontal channel connecting the plurality of vertical channels. The horizontal channel is provided under the stack structure. A plurality of first lower wiring patterns is disposed between the substrate and the stack structure and electrically connected to the channel structure. Each of the plurality of first lower wiring patterns comprises a first portion and a second portion having different widths from each other in the first direction.

According to an exemplary embodiment of the present inventive concept, a semiconductor device is provided as follows. A lower interlayer dielectric layer is on a substrate. A plurality of gate electrodes are vertically spaced apart from each other and stacked on the lower interlayer dielectric layer. A channel structure includes a plurality of vertical channels penetrating the plurality of gate electrodes and a horizontal channel connected to a bottom end of each of the plurality of vertical channels. A lower wiring pattern is in the lower interlayer dielectric layer and electrically connected to the channel structure. The lower wiring pattern comprises a plurality of first lower wiring patterns and a plurality of second lower wiring patterns. The first lower wiring patterns are spaced apart from each other in a first direction. Each first lower wiring pattern extends along a second direction crossing the first direction. The plurality of second lower wiring patterns are spaced apart from each other in the second direction. Each second lower wiring pattern extends along the first direction. The plurality of second lower wiring patterns run across the plurality of first lower wiring patterns to constitute a grid structure. Each of the plurality of first lower wiring patterns comprises a portion having a width that decreases away from an intersection where each of the plurality of first lower wiring patterns crosses one of the plurality of second lower wiring patterns.

BRIEF DESCRIPTION OF THE DRAWINGS

These and other features of the present inventive concept will become more apparent by describing in detail exemplary embodiments thereof with reference to the accompanying drawings of which:

FIGS. 6A to 18A are cross-sectional views corresponding to line I-I' of FIG. 2 for explaining a method of fabricating a semiconductor device according to exemplary embodiments of the present inventive concept;

FIGS. 6B to 18B are cross-sectional views corresponding to line II-II' of FIG. 2;

FIGS. 14C to 17C are cross-sectional views corresponding to line III-III' of FIG. 2.

DETAILED DESCRIPTION OF EXEMPLARY EMBODIMENTS

Hereinafter, exemplary embodiments of the present inventive concept will be described in detail in conjunction with the accompanying drawings. As used herein, singular "a," "an," and "the" are intended to cover the plural forms as well, unless the context clearly indicates otherwise.

Figure 1:
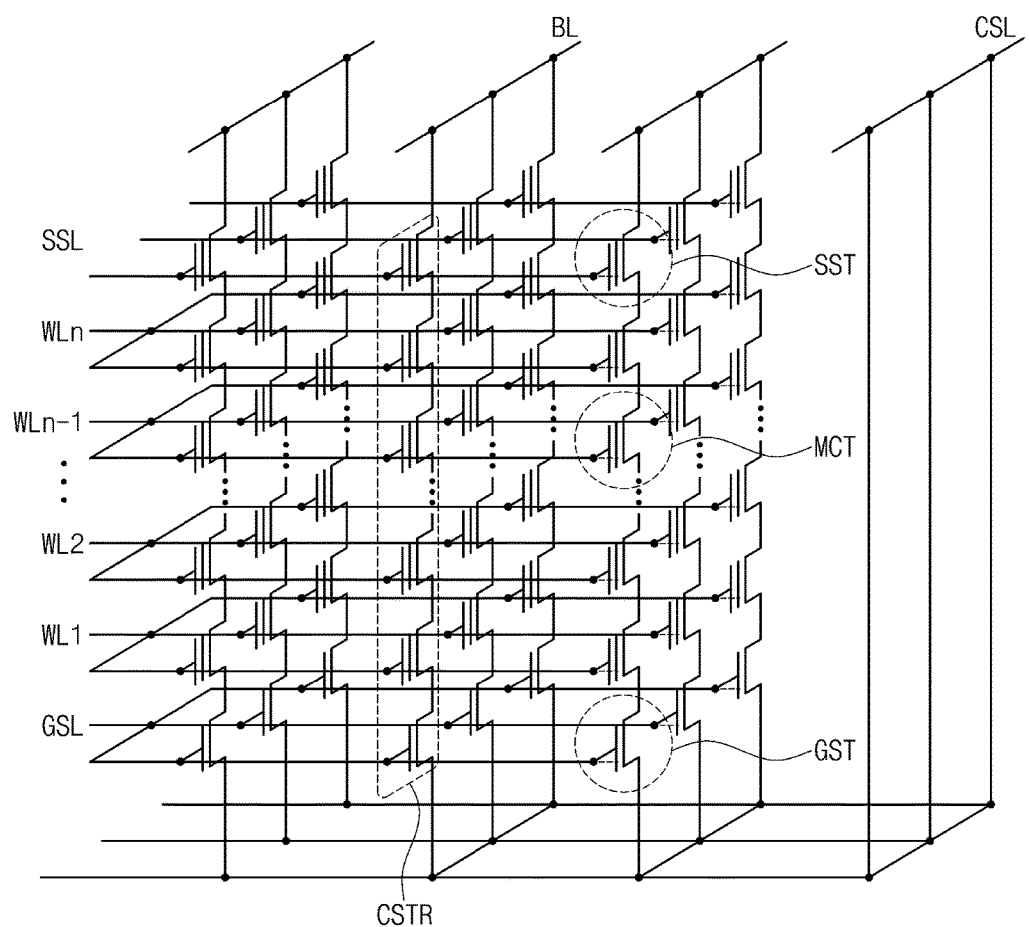
FIG. 1 is a simplified circuit diagram illustrating a cell array of a semiconductor device according to exemplary embodiments of the present inventive concept.

FIG. 1 is a circuit diagram illustrating a cell array of a semiconductor device according to exemplary embodiments of the present inventive concept.

Referring to FIG. 1, a cell array of a semiconductor device according to exemplary embodiments includes a common source line CSL, a plurality of bit lines BL, and a plurality of cell strings CSTR disposed between the common source line CSL and the bit lines BL.

The common source line CSL may be a conductive thin layer disposed on a substrate or an impurity region formed in the substrate. The bit lines BL may be conductive patterns (e.g., metal lines) spaced apart from and disposed on the substrate. The bit lines BL are two-dimensionally arranged, and the cell strings CSTR may be connected in parallel to each of the bit lines BL. The bit lines BL are spaced apart from each other in a first direction D1. Each of the bit lines BL extends in a second direction D2 crossing the first direction D1. The first direction D1 and the second direction D2 may be in parallel to a top surface of a substrate. The cell strings CSTR are connected in common to the common source line CSL. For example, the cell strings CSTR are disposed between each of the bit lines BL and the common source line CSL. In some embodiments, the common source line CSL is provided in plural. The common source line CSL in plural is two-dimensionally arranged. For example, the common source line CSL in plural may be supplied with the same voltage or electrically controlled independently of each other.

Each of the cell strings CSTR includes a ground select transistor GST connected to the common source line CSL, a string select transistor SST connected to one of the bit lines BL, and a plurality of memory cell transistors MCT disposed between the ground select transistor GST and the string select transistor SST. The ground select transistor GST, the memory cell transistors MCT and the string select transistor SST are stacked in the listed order along a third direction D3 substantially perpendicular to the first direction D1 and the second direction D2. The third direction D3 may be substantially perpendicular to the top surface of the substrate. The ground select transistor GST, the memory cell transistors MCT and the string select transistor SST are connected in series.

The common source line CSL is connected in common to a source of the ground select transistor GST in each of the cell strings CSTR. In addition, the common source line CLS and the bit lines BL may be provided therebetween with a ground select line GSL, a plurality of word lines WL1 to WLn, and a plurality of string select lines SSL, which may be used as gate electrodes of the ground select transistor GST, the memory cell transistors MCT, and the string select transistor SST, respectively. Moreover, each of the memory cell transistors MCT may include a data storage element.

Figure 2:
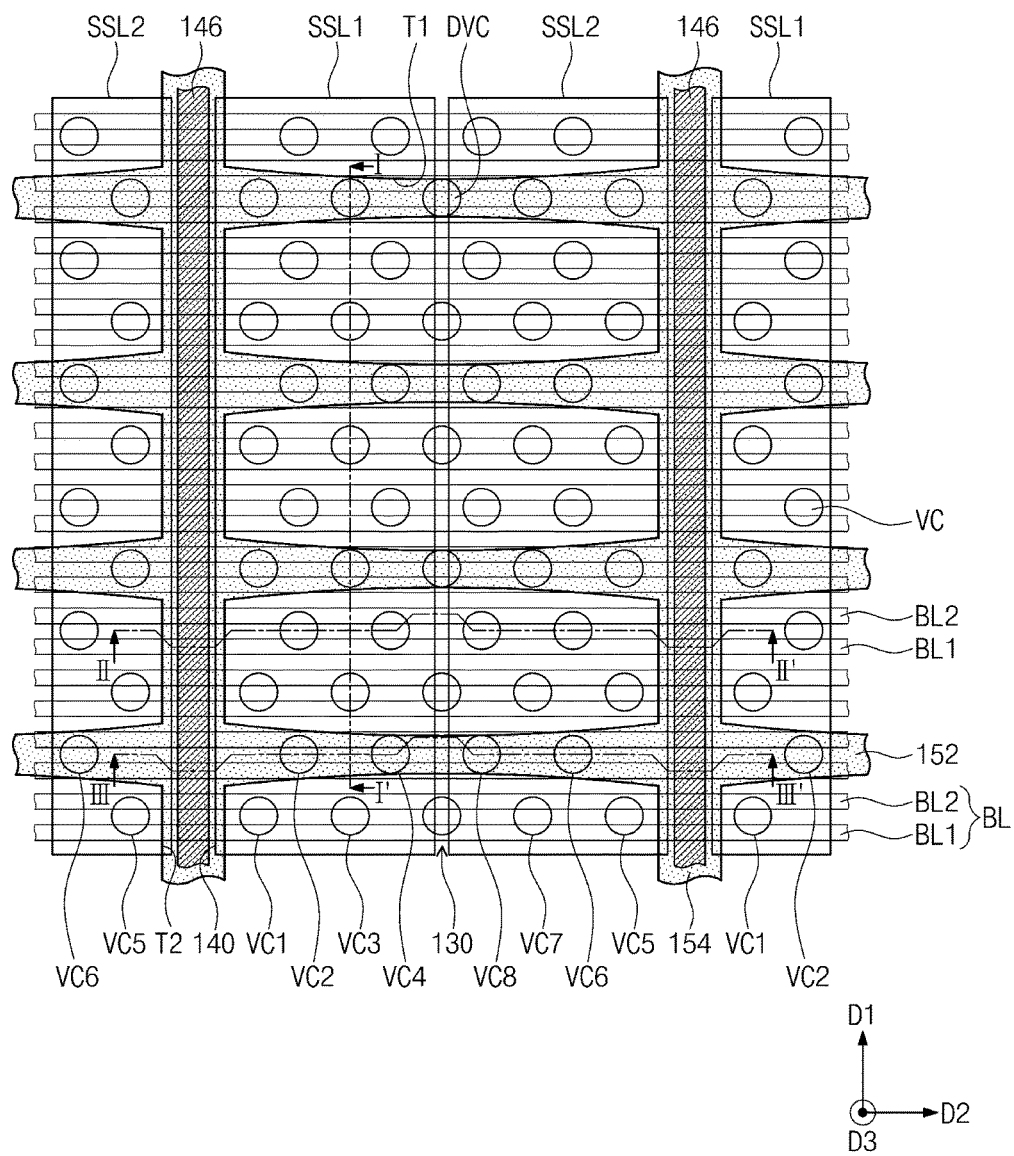
FIG. 2 is a plan view for explaining a semiconductor device according to exemplary embodiments of the present inventive concept.
Figure 3A:
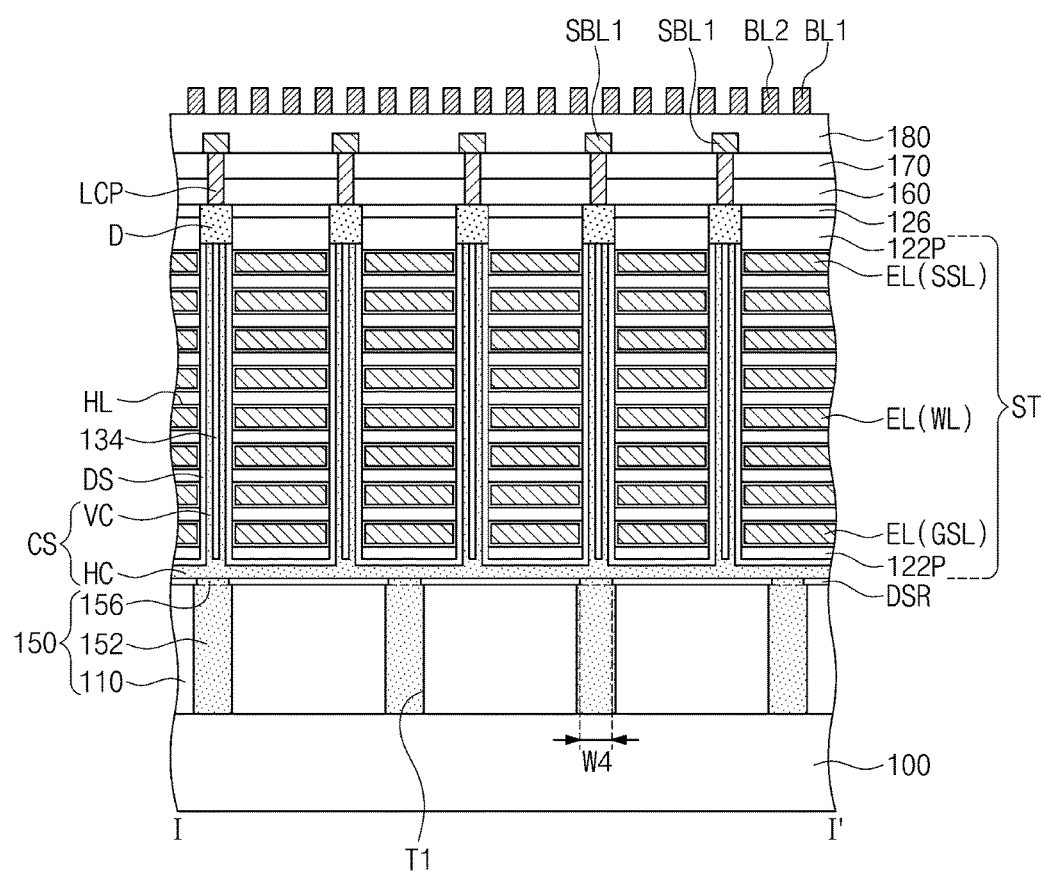
FIGS. 3A, 3B, and 3C are cross-sectional views respectively taken along lines I-I', II-II', and III-III' of FIG. 2.
Figure 3B:
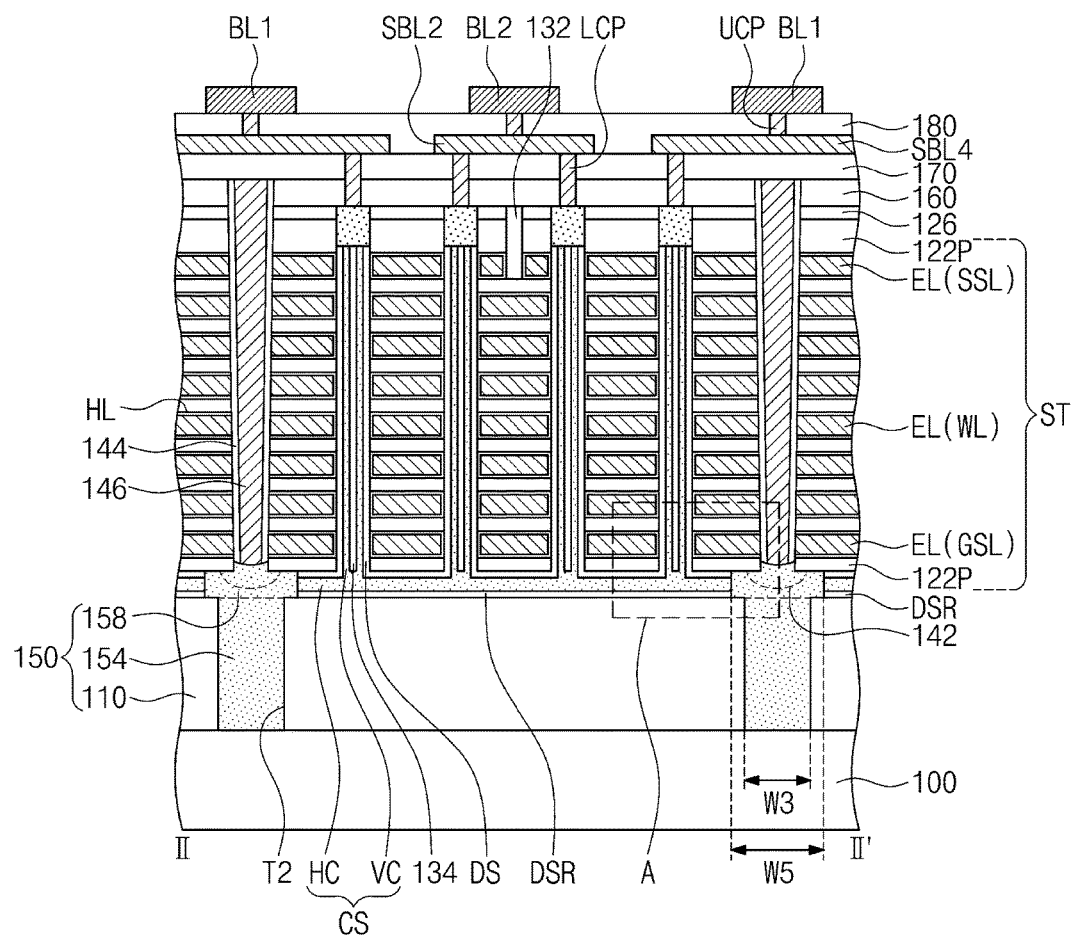
Figure 3C:
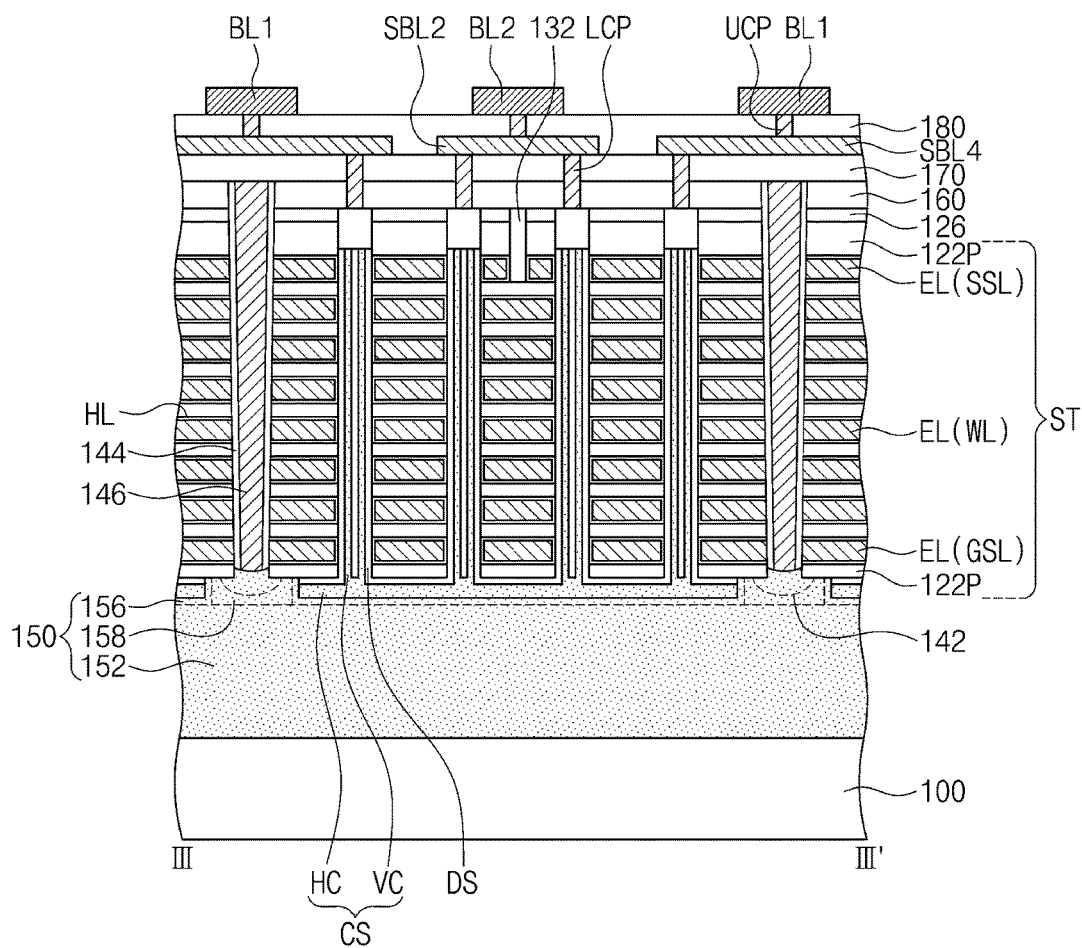
Figure 4A:
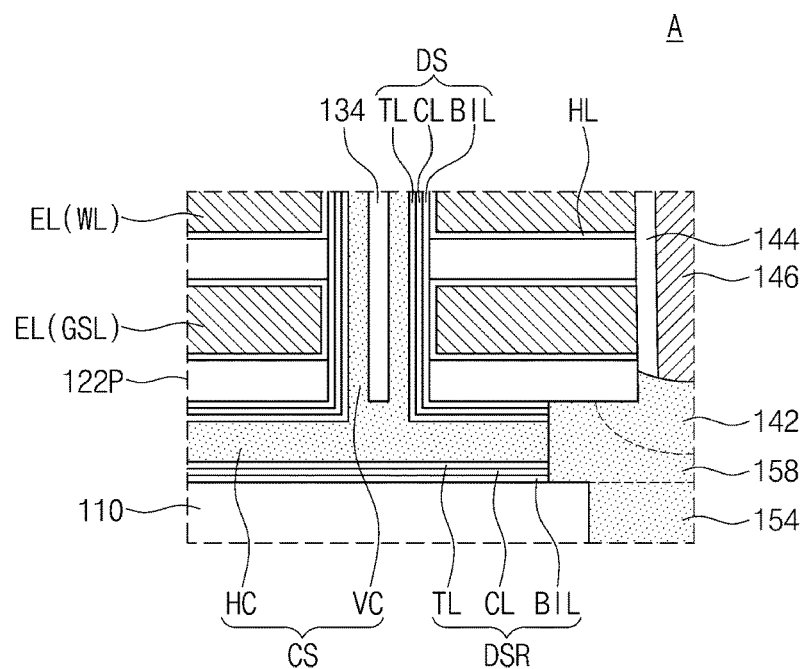
FIGS. 4A and 4B are enlarged views corresponding to section A of FIG. 3A.
Figure 4B:
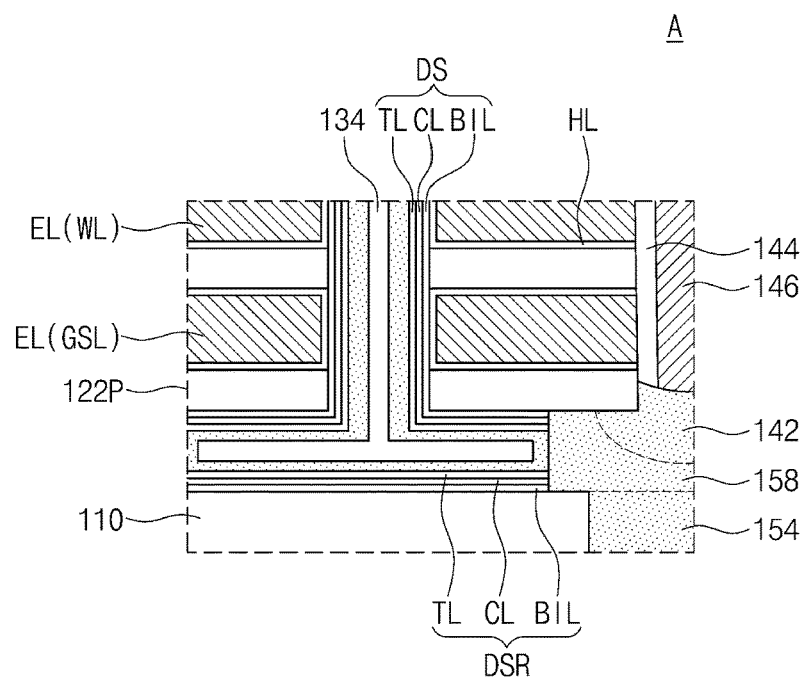
Figure 5A:
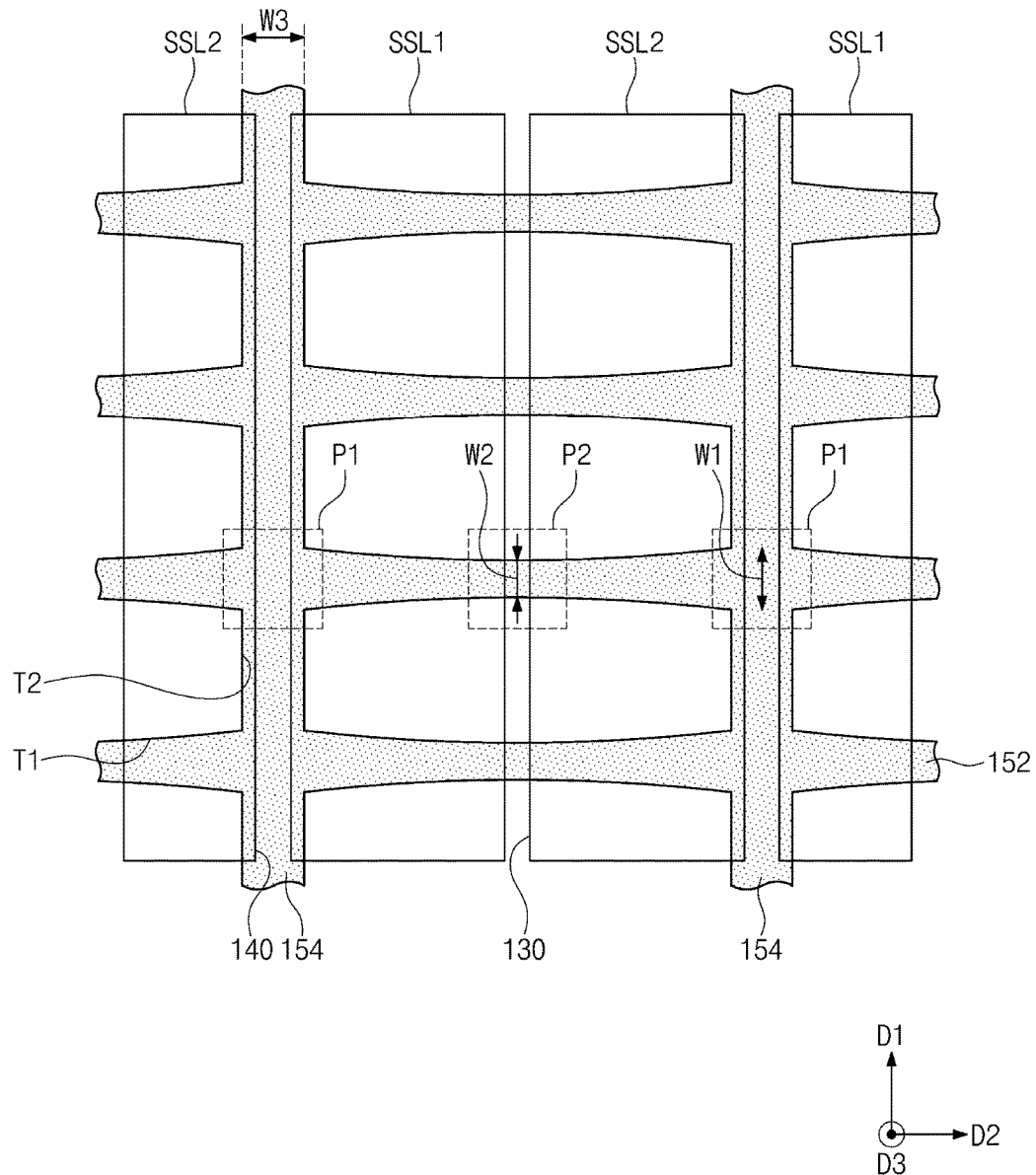
FIGS. 5A and 5B are plan views for explaining lower wiring patterns according to exemplary embodiments of the present inventive concept.
Figure 5B:
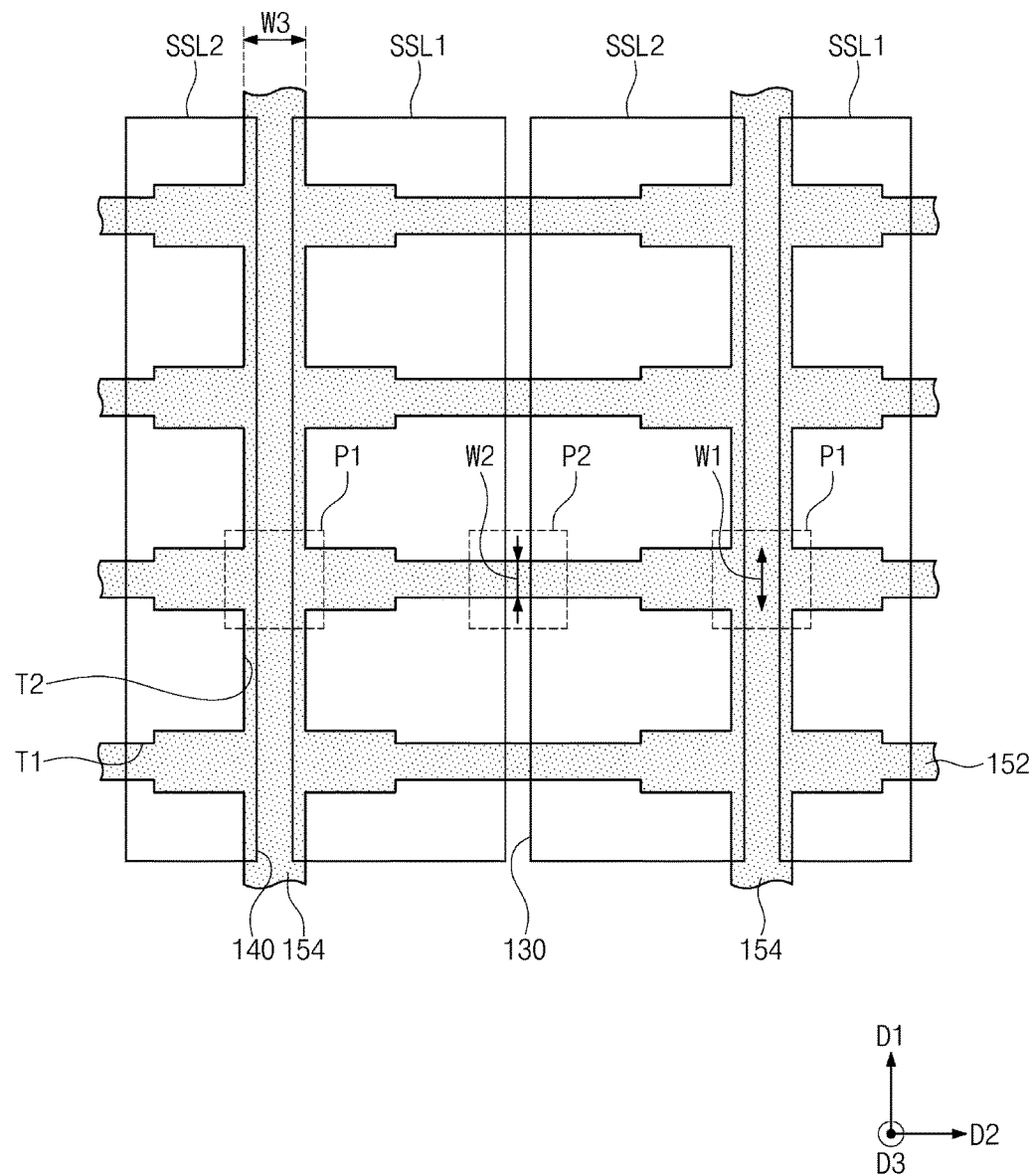
Figure 5C:
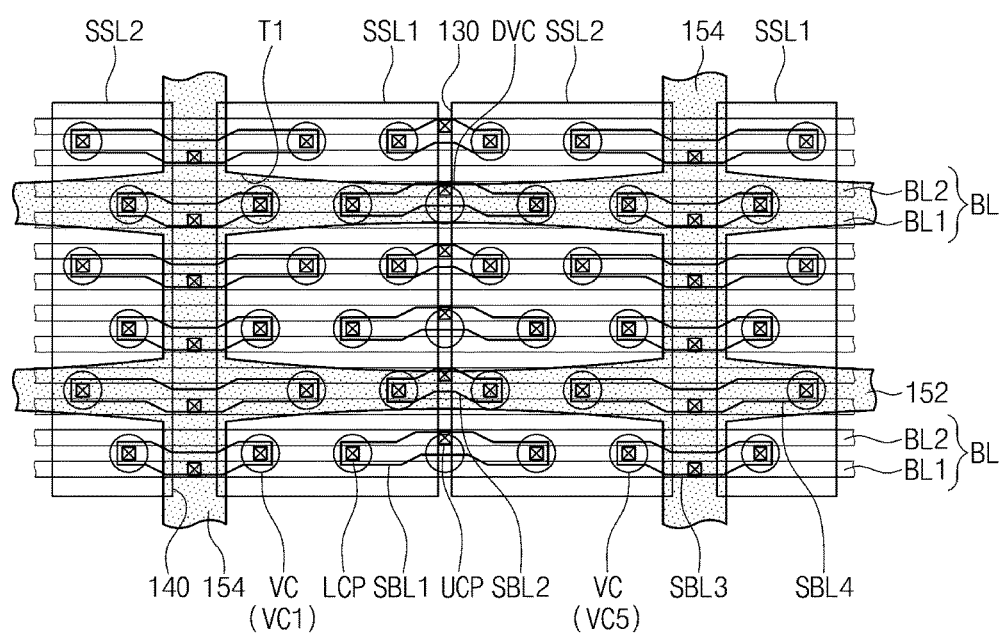
FIG. 5C is a plan view illustrating a portion of FIG. 2 for explaining an upper wiring structure according to exemplary embodiments of the present inventive concept.

FIG. 2 is a plan view for explaining a semiconductor device according to exemplary embodiments of the present inventive concept. FIGS. 3A, 3B, and 3C are cross-sectional views respectively taken along lines I-I', II-II', and III-III' of FIG. 2. FIGS. 4A and 4B are enlarged views corresponding to section A of FIG. 3B. FIGS. 5A and 5B are plan views for explaining lower wiring patterns of a semiconductor package according to exemplary embodiments of the present inventive concept. FIG. 5C is a plan view illustrating a portion of FIG. 2 for explaining an upper wiring structure according to exemplary embodiments of the present inventive concept.

Referring to FIGS. 2, 3A to 3C, and 4A, a plurality of stack structures ST are disposed on a substrate 100, and a lower wiring structure 150 is disposed between the substrate 100 and the stack structures ST. The stack structures ST are horizontally separated by a plurality of first separation regions 140 extending in a first direction D1. For example, as shown in FIG. 2, the stack structures ST extend in the first direction D1 and be spaced apart from each other in the second direction D2 crossing (e.g., perpendicular to) the first direction D1. The first direction D1 and the second direction D2 are substantially in parallel to a top surface of the substrate 100. The substrate 100 may be a semiconductor substrate having a first conductivity, for example, a p-type conductivity. The semiconductor substrate may include a single crystalline silicon layer, an SOI (silicon on insulator) substrate, a silicon layer formed on a silicon-germanium (SiGe) layer, a single crystalline silicon layer formed an insulation layer, or a polysilicon layer formed on an insulation layer. The lower wiring structure 150 includes a lower interlayer dielectric layer 110, a first lower wiring pattern 152 and a second lower wiring pattern 154, and a first connecting conductive pattern 156 and a second connecting conductive pattern 158. The lower wiring structure 150 will be explained in detail below.

Each of the stack structures ST includes a plurality of insulation patterns 122P and a plurality of gate electrodes EL that are vertically and alternately stacked on the substrate 100. The gate electrodes EL include a ground select line GSL, a plurality of word lines WL, and a string select line SSL that are sequentially stacked on the substrate 100. The ground select line GSL, the word lines WL, and the string select line SSL may correspond respectively to the ground select line GSL, the word lines WL0 to WL3, and the string select line SSL discussed with reference to FIG. 1. The ground select line GSL and the string select line SSL each is provided in singular form, and six word lines WL are stacked between the ground select line GSL and the string select line SSL. The present inventive concept is not limited thereto. For example, the ground select line GSL and the string select line SSL may each be provided in plural, and seven or more word lines WL may be provided. The gate electrodes EL may include doped semiconductor (e.g., doped silicon, etc.), metal (e.g., tungsten), conductive metal nitride (e.g., titanium nitride, tantalum nitride, or tungsten nitride), or transition metal (e.g., titanium or tantalum).

The insulation patterns 122P may each have a thickness that is changed based on characteristics of a semiconductor device. In some embodiments, the insulation patterns 122P may have substantially the same thickness. In some embodiments, at least one (e.g., an uppermost insulation pattern) of the insulation patterns 122P may be formed thicker than other insulation patterns 122P between the word lines WL. The insulation patterns 122P may include, for example, a silicon oxide layer or a low-k dielectric layer.

In some embodiments, the string select line SSL of each stack structure ST includes two string select lines SSL1 and SSL2 separated from each other by a second separation region 130 extending in the first direction D1. For example, each of the stack structures ST includes a first string select line SSL1 and a second string select line SSL2 that extend in the first direction D1 and are spaced apart from each other in the second direction D2. A separation insulation pattern 132 may be provided in the second separation region 130 between the first string select line SSL1 and the second string select line SSL2. The second separation region 130 separates the string select line SSL without dividing the word lines WL below the string select line SSL. For example, as shown in FIGS. 3A to 3C, the separation insulation pattern 132 has a bottom surface higher than a top surface of an uppermost one of the word lines WL and equal to or lower than a bottom surface of the string select line SSL. In this configuration, the first separation regions 140 and the second separation region 130 define the first string select line SSL1 and the second string select line SSL2. The first separation regions 140 horizontally separate neighboring string select lines of the stack structures ST disposed along the second direction D2, and the second separation region 130 horizontally separates a string select line included in a single stack structure ST into the first string select line SSL1 and the second string select line SSL2. The first separation regions 140 and the second separation region 130 may be alternately provided along the second direction D2. For example, the second separation region 130 is disposed between the first separation regions 140 adjacent to each other. The second separation region 130 may have a width less than widths of the first separation regions 140. Although not shown, the stack structures ST may each have a stepwise structure at its end portion. For example, the stack structure ST may have on its end portion a height that stepwise decreases along a direction away from the stack structure ST.

The gate electrodes EL included in each stack structure ST may be combined with a channel structure CS to constitute memory cell transistors (see MCT of FIG. 1), strings select transistors (see SST of FIG. 1), and ground select transistors (see GST of FIG. 1). The channel structure CS includes a plurality of vertical channels VC penetrating one of the stack structures ST and a horizontal channel HC horizontally connecting the vertical channels VC under the one of the stack structure ST. The vertical channels VC extend in the third direction D3 substantially perpendicular to the top surface of the substrate 100, and be connected to the gate electrodes EL. For example, the vertical channels VC may have a hollow pipe or macaroni shape. In this case, the hollow vertical channels VC may each have an inside filled with a filling insulation pattern 134. In some embodiments, the filling insulation pattern 134 may include a silicon oxide layer. Alternatively, the vertical channels VC may have a pillar shape. In this case, no filling insulation pattern 134 may be provided. A plurality of conductive pads D are each positioned on an upper end of one of the vertical channels VC. For example, the conductive pads D are each in contact with the upper end of one of the vertical channels VC. The conductive pads D may include an impurity-doped region or a conductive material.

The vertical channels VC may be disposed spaced apart from each other along the first direction D1 and the second direction D2. In some embodiments, the vertical channels VC penetrating one of the stack structures ST includes first to eighth vertical channels VC1 to VC8 arranged in a zigzag fashion along the second direction D2. The first to fourth vertical channels VC1 to VC4 are coupled to the first string select line SSL1, and the fifth to eighth vertical channels VC5 to VC8 are coupled to the second string select line SSL2. For example, the first vertical channel VC1 and the third vertical channel VC3 are adjacent to each other in the second direction D2, and disposed in a diagonal direction to the second vertical channel VC2 and the fourth vertical channel VC4, respectively. Likewise, the fifth and seventh vertical channels VC5 and VC7 are adjacent to each other in the second direction D2, and disposed in a diagonal direction to the sixth vertical channel VC6 and the eighth vertical channel VC8. Each of the first to eighth vertical channels VC1 to VC8 is provided in plural along the first direction D1, which may constitute first to eighth columns. As viewed in plan, the first to fourth vertical channels VC1 to VC4 penetrating the first string select line SSL1 and the fifth to eighth vertical channels VC5 to VC8 penetrating the second string select line SSL2 are arranged in a mirror symmetry across one of the first separation regions 140 or the second separation region 130. For example, the fourth channel VC4 and the eighth vertical channel VC8 are adjacent to each other in the second direction D2 across the second separation region 130 or the separation insulation pattern 132. The number of the columns of the vertical channels VC penetrating one of the stack structures ST is not limited to eight but may be variously changed. For example, one of the stack structures ST may have four columns of the vertical channels VC penetrating therethrough. In this case, the first and second string select lines SSL1 and SSL2 may be integrally connected to constitute a single body without the separation insulation pattern 132.

The horizontal channel HC extends from bottom ends of the vertical channels VC and is disposed under one of the stack structures ST. The horizontal channel HC extends along the first direction D1 and is connected in common to the vertical channels VC arranged along the first direction D1 and the second direction D2. The vertical channels VC and the horizontal channel HC may be composed of a single semiconductor layer continuously extending without interruption. In some embodiments, as shown in FIG. 4A, the horizontal channel HC may have a plate shape parallel to the top surface of the substrate 100. In other embodiments, as shown in FIG. 4B, the horizontal channel HC may have a hollow pipe or macaroni shape connected to the vertical channels VC. In this configuration, the vertical channels VC and the horizontal channel HC may be integrally combined to form a unitary pipe shape. In this case, the vertical channels VC and the horizontal channel HC each has a hollow inside filled with the filling insulation pattern 134. For example, the filling insulation pattern 134 extends from the inside of each of the vertical channels VC to the inside of the horizontal channel HC. As viewed in plan, the horizontal channel HC overlaps one of the stack structures ST, and has a width in the second direction D2 less than that of the one of the stack structures ST.

The vertical channels VC and the horizontal channel HC may be composed of a semiconductor material, which may be undoped with an impurity or doped with an impurity having a first conductivity that is the same as that of the substrate 100. For example, the vertical channels VC and the horizontal channel HC may include silicon (Si), germanium (Ge), or a mixture thereof. The vertical channels VC and the horizontal channel HC may include a crystalline structure, an amorphous structure, and a polycrystalline structure.

In some embodiments, a plurality of dummy vertical channels DVC penetrate one of the stack structures ST between the first string line SSL1 and the second string line SSL2. The dummy vertical channels DVC may penetrate the separation insulation pattern 132. The dummy vertical channels DVC are arranged along the first direction D1. The dummy vertical channels DVC may have the same structure as that of the vertical channels VC. For example, the dummy vertical channels DVC may have bottom ends connected to the horizontal channel HC. As shown in FIG. 2, one of the stack structures ST is provided with first to ninth columns of the vertical channels, and the dummy vertical channels DVC are arranged in the fifth column. The dummy vertical channels DVC need not be connected to bit lines which will be described below.

A data storage pattern DS is disposed between the stack structures ST and the vertical channels VC. The data storage pattern DS extend or is further disposed between the horizontal channel HC and bottom surfaces of the stack structures ST. For example, the data storage pattern DS is further disposed between the horizontal channel HC and a bottom surface of a lowermost gate electrode of the gate electrodes in each of the stack structures ST. A residual data storage pattern DSR is interposed between the horizontal channel HC and the lower interlayer dielectric layer 110, and spaced apart from the data storage pattern DS. The data storage pattern DS and the residual data storage pattern DSR may be composed of the same thin layer.

For example, when a vertical NAND Flash memory device is adopted as a semiconductor device of the present inventive concept, as shown in FIGS. 4A and 4B, each of the data storage pattern DS and the residual data storage pattern DSR includes a tunnel insulation layer TL, a charge storage layer CL, and a blocking insulation layer BIL. Data stored in the data storage pattern DS may be changed using Fouler-Nordheim tunneling induced by a voltage difference between the gate electrodes EL and the vertical channels VC including a semiconductor material. Alternatively, the data storage pattern DS may be a thin layer to store information based on different operating principles. For example, the data storage pattern DS may be a thin layer for a phase change memory device or a variable resistance memory device.

The data storage pattern DS and the residual data storage pattern DSR may be configured such that the charge storage layer CL includes an insulation layer rich in trap sites and an insulation layer including nano-particles. The charge storage layer CL may be formed using a chemical vapor deposition process or an atomic layer deposition process. For example, the charge storage layer CL may include a trap insulation layer, a floating gate electrode, or an insulation layer including conductive nano-dots. In more detail, the charge storage layer CL may include a silicon nitride layer, a silicon oxynitride layer, a silicon-rich nitride layer, a nano-crystalline silicon layer, or a laminated trap layer. The tunnel insulation layer TL may be one of materials having a band gap wider than that of the charge storage layer CL, and may be formed using a chemical vapor deposition process or an atomic layer deposition process. For example, the tunnel insulation layer TL may be a silicon oxide layer formed using one of the deposition techniques discussed above. Alternatively, the tunnel insulation layer TL may be a high-k dielectric layer such as an aluminum oxide layer, a hafnium oxide layer, etc. The blocking insulation layer BIL may include a material having a band gap narrower than that of the tunnel insulation layer TL and wider than that of the charge storage layer CL. The blocking insulation layer BIL may include a high-k dielectric layer such as an aluminum oxide layer, a hafnium oxide layer, etc. The blocking insulation layer BIL may be formed using a chemical vapor deposition process, an atomic layer deposition process, or a wet oxidation process. The blocking insulation layer BIL may include first and second blocking insulation layers. In this case, the first blocking insulation layer may include a high-k dielectric layer such as an aluminum oxide, hafnium oxide layer, etc., and the second blocking insulation layer may include a material whose dielectric constant is less than that of the first blocking insulation layer. Alternatively, the second blocking insulation layer may include a high-k dielectric layer, and the first blocking insulation layer may include a material whose dielectric constant is less than that of the second blocking insulation layer.

In some embodiments, a horizontal insulation pattern HL extends onto top and bottom surfaces of one of the gate electrodes EL from between the data storage pattern DS and the one of the gate electrodes EL. The horizontal insulation pattern HL is provided in plural. The horizontal insulation pattern HL in plural includes a horizontal insulation pattern that extends between the separation insulation pattern 132 and the first string select lines SSL1 and between the separation insulation pattern 132 and the second string select line SSL2. For example, when a vertical NAND Flash memory device is adopted as a semiconductor device of the present inventive concept, the horizontal insulation pattern HL may be used as a blocking insulation layer. In this case, the horizontal insulation pattern HL may include a high-k dielectric layer such as aluminum oxide layer, hafnium oxide layer, etc., and the blocking insulation layer BIL may include a silicon oxide layer.

The substrate 100 is provided on its entire surface with a buried insulation layer 126 covering the stack structures ST. The buried insulation layer 126 may cover the stepwise structural end portions of the stack structures ST. The buried insulation layer 126 may provide flat surfaces on the stack structures ST. The conductive pads D penetrate the buried insulation layer 126 to be connected to the vertical channels VC. The upper surfaces of the conductive pads D are positioned at substantially the same height as an upper surface of the buried insulation layer 126. The present inventive concept is not limited thereto. For example, the vertical channels VC may extend in the third direction D3 to penetrate the buried insulation layer 126. In this case, the vertical channels VC may have top surfaces at substantially the same height as that of a top surface of the buried insulation layer 126.

Hereinafter, the lower wiring structure 150 will be described in detail. The lower interlayer dielectric layer 110 is disposed between the substrate 100 and the stack structures ST. The lower interlayer dielectric layer 110 may be a single layer or a multiple layer. For example, the lower interlayer dielectric layer 110 may include silicon oxide, silicon nitride, silicon oxynitride, or a low-k dielectric material. The first lower wiring pattern 152 and the second lower wiring pattern 154 are provided in a first lower trench T1 and a second lower trench T2 respectively, which penetrate the lower interlayer dielectric layer 110 and expose the substrate 100. For example, the first lower wiring pattern 152 in plural is arranged along the first direction D1. The first lower wiring pattern 152 extends in the second direction D2. The second lower wiring pattern 154 in plural is arranged along the second direction D2. The second lower wiring pattern 154 extends in the first direction D1. The first lower wiring pattern 152 and the second lower wiring pattern 154 may cross each other to constitute a grid structure. In this configuration, the first lower wiring pattern 152 and the second lower wiring pattern 154 are connected to each other at their crossing sections or at their intersection. The first lower wiring pattern 152 and the second lower wiring pattern 154 may include a conductive material, for example, polysilicon.

As viewed in plan, the first lower wiring pattern 152 extends in the second direction D2 to run across the stack structures ST. The first lower wiring pattern 152 is disposed in plural. The first lower wiring pattern 152 in plural is arranged in the first direction. The first lower wiring pattern 152 has a varying width in the second direction. The width is measured in the first direction D1. For example, the first lower wiring pattern 152 has a width, which is measured in the first direction D1 and the width of the first lower wiring pattern 152 varies along the second direction D2. For example, referring to FIGS. 5A and 5B, the first lower wiring pattern 152 includes a first portion P1 adjacent to edges of the stack structures ST and a second portion P2 between two first portions of the first portion P1 in plural. The first portion P1 of the first lower wiring pattern 152 overlaps the first separation regions 140, and the second portion P2 of the first lower wiring pattern 152 overlaps the second separation region 130. The second portion P2 has a second width W2 less than a first width W1 of the first portion P1. In some embodiments, as shown in FIG. 5A, the first lower wiring pattern 152 has a gradually-decreasing width toward the second portion P2 from the first portion P1. In other words, the first lower wiring pattern 152 has opposite sidewalls, which face each other in the first direction D1 and are concave to each other. In other embodiments, as shown in FIG. 5B, the first lower wiring pattern 152 has a stepwise-decreasing width toward the second portion P2 from the first portion P1. In other words, the first lower wiring pattern 152 has opposite sidewalls, which face each other in the first direction D1 and have discontinuous profiles (i.e., not aligned with each other in the second direction D2). In some embodiments, the second portion P2 may be a portion having a smallest width.

The second lower wiring pattern 154 is positioned under one of the first separation regions 140. The second lower wiring pattern 154 is disposed in plural. In this sense, as viewed in plan, the second lower wiring pattern 154 in plural overlaps the first separation regions 140. The second lower wiring pattern 154 extends in the first direction D1 and have a third width W3 that is uniform along the first direction D1. The third width W3 is measured in the second direction D2. As viewed in cross-section, figures illustrate that the first width W1 and the second width W2 of the first lower wiring pattern 152 and the third width W3 of the second lower wiring pattern 154 are each constant along its depth direction, but the present inventive concept is not limited thereto. For example, the first width W1 and the second width W2 of the first lower wiring pattern 152 and the third width of the second lower wiring pattern 154 may decrease as approaching the substrate 100, in a cross-sectional view. In this case, the first to third widths W1, W2, and W3 may be defined to represent widths (i.e., maximum widths as viewed in cross-section) of top ends of the first lower wiring pattern 152 and the second lower wiring pattern 154.

The first connecting conductive pattern 156 is disposed on the first lower wiring pattern 152. The first connecting conductive pattern 156 is in contact with the first lower wiring pattern 152. The second connecting conductive pattern 158 is disposed on the second lower wiring pattern 154. The second connecting conductive pattern 158 is in contact with the second lower wiring pattern 154. The first connecting conductive pattern 156 connects the first lower wiring pattern 152 to the horizontal channel HC of the channel structure CS. In this configuration, the first connecting conductive pattern 156 penetrates the residual data storage pattern DSR to be coupled to the horizontal channel HC. In other words, the residual data storage pattern DSR need not be interposed between the first lower wiring pattern 152 and the horizontal channel HC. The first connecting conductive pattern 156, extending in the second direction D2 along the first lower wiring pattern 152, is coupled to a sidewall of the second connecting conductive pattern 158. As shown in FIG. 3C, the first connecting conductive pattern 156 is in contact with the sidewall of the second connecting conductive pattern 158. The first connecting conductive pattern 156 has a fourth width W4 that is measured in the first direction D1 and less than the widths W1 and W2 of the first lower wiring pattern 152, but the present inventive concept is not limited thereto.

The second connecting conductive pattern 158 may extend in the first direction D1 along the second lower wiring pattern 154 below the second connecting conductive pattern 158. The second connecting conductive pattern 158 is connected the horizontal channel HC. As shown in FIG. 3B, the horizontal channel HC is provided in plural, and the second connecting conductive pattern 158 connects two horizontal channels of the horizontal channel HC in plural. The two horizontal channels are spaced apart from each other in the second direction D2. For example, on areas where the first lower wiring patterns 152 and the second lower wiring patterns 154 are not crossing each other, the second connecting conductive pattern 158 has a sidewall in contact with the horizontal channel HC, the data storage pattern DS, and the residual data storage pattern DSR (see FIG. 3B). In contrast, on areas where the first lower wiring pattern 152 and the second lower wiring pattern 154 cross or intersect each other, the second connecting conductive pattern 158 is connected through the first connecting conductive pattern 156 to the horizontal channel HC (see FIG. 3C). The second connecting conductive pattern 158 has a fifth width W5 that is measured in the second direction D2 and greater than the third width W3 of the second lower wiring pattern 154. The present inventive concept is not limited thereto. In other embodiments, the fifth width W5 may be similar to the third width W3. The second connecting conductive pattern 158 may have upper portions protruding into one of the first separation regions 140. In this case, a top end of the second connecting conductive pattern 158 may be lower than a top surface of the lowermost insulation pattern of the insulation patterns 122P.

For example, the horizontal channel HC may be electrically connected through the first connecting conductive patterns 156 to the first lower wiring patterns 152, and through the second connecting conductive patterns 158 to the second lower wiring patterns 154. The vertical channels VC may be connected at their bottom ends to the horizontal channel HC. For example, the horizontal channel HC may be connected to the substrate 100 through the first connecting conductive pattern 156 and the second connecting conductive pattern 158 and the first lower wiring pattern 152 and the second lower wiring pattern 154, and thereby electrically connected to the substrate 100.

A common source region 142 is provided in the second connecting conductive pattern 158. The common source region 142 may extend in the first direction D1 along the second connecting conductive pattern 158. The common source region 142 may be formed by doping the second connecting conductive patterns 158 with an impurity having a second conductivity different from that of the substrate 100. For example, the common source region 142 may include an n-type impurity such as phosphorous, arsenic, antimony, etc. The second connecting conductive pattern 158 may further include carbon (C). Since the second connecting conductive pattern 158 includes carbon, when the second connecting conductive pattern 158 is formed, the etching of the second connecting conductive pattern 158 may be suppressed in a wet etching process on polysilicon. The first separation regions 140 each is provided therein with a common source plug 146 connected to the common source region 142. The common source plug 146 may extend in the first direction D1 within each of the first separation regions 140. The present inventive concept, however, is not limited thereto. For example, the common source plug 146 may be provided in a pillar shape and locally connected to one of the common source regions 142. The common source plug 146 may include one or more of metal (e.g., tungsten) and conductive metal nitride (e.g., titanium nitride, tantalum nitride, or tungsten nitride). The second connecting conductive pattern 158 is provided in one of the common source regions 142 to form a reduced current path between the horizontal channel HC and the common source plug 146. An insulation spacer 144 is interposed between the common source plug 146 and the stack structures ST. The insulation spacer 144 may include, for example, a silicon oxide layer or a silicon nitride layer.

The buried insulation layer 126 may be sequentially provided thereon with a first upper interlayer dielectric layer 160, a second upper interlayer dielectric layer 170, and a third upper interlayer dielectric layer 180 covering the stack structures ST. The first separation regions 140 extend into the first upper interlayer dielectric layer 160. For example, the insulation spacer 144 and the common source plug 146 have top surfaces at substantially the same height as that of a top surface of the first upper interlayer dielectric layer 160.

Subsidiary lines SBL1, SBL2, SBL3, and SBL4 are disposed on the second upper interlayer dielectric layer 170. The subsidiary lines SBL1 to SBL4 may be electrically connected to the vertical channels VC through a lower contact LCP penetrating the first upper interlayer dielectric layer 160 and the second upper interlayer dielectric layer 170. For example, each of the subsidiary lines SBL1 to SBL4 may electrically connect a pair of the vertical channels VC, which are respectively connected to the first string select line SSL1 and the second string select line SSL2 different from each other and disposed adjacent to each other in the second direction D2.

Referring to FIGS. 2 and 5C, a first subsidiary line SBL1 may connect the third vertical channel VC3 and the seventh vertical channel VC7 spaced apart from each other in the second direction D2 across the second separation region 130, and a second subsidiary lines SBL2 may connect the fourth vertical channel VC4 and the eighth vertical channel VC8 spaced apart from each other in the second direction D2 across the second separation region 130. The first subsidiary line SBL1 and the second subsidiary line SBL2 may be alternately disposed along the first direction D1. Each of the first subsidiary line SBL1 and the second subsidiary line SBL2 may be elongated in the second direction D2 and may include a portion that protrudes in the first direction D1. The first subsidiary line SBL1 and the second subsidiary line SBL2 may cross over the second separation region 130.

A third subsidiary line SBL3 may connect the first vertical channel VC1 and the fifth vertical channel VC5 spaced apart from each other in the second direction D2 across a left first separation region of the first separation regions 140. A fourth subsidiary lines SBL4 may connect the second vertical channel VC2 and the sixth vertical channel VC6 spaced apart from each other in the second direction D2 across the second separation region 130. The third subsidiary line SBL3 and the fourth subsidiary line SBL4 may be alternately disposed along the first direction D1. The third subsidiary line SBL3 and the fourth subsidiary line SBL4 may be spaced apart respectively from the first subsidiary line SBL1 and the second subsidiary line SBL2 in the second direction D2 or in a direction reverse to the second direction D2. Each of the third subsidiary line SBL3 and the fourth subsidiary line SBL4 may be elongated in the second direction D2 and may include a portion that protrudes in a direction reverse to the first direction D1. The third subsidiary line SBL3 and the fourth subsidiary line SBL4 may cross over the first separation region 140.

Referring to FIGS. 2, 3A to 3C, and 4A, the third upper interlayer dielectric layer 180 may cover the subsidiary lines SBL1 to SBL4, and bit lines BL1 and BL2 may be disposed on the third upper interlayer dielectric layer 180. The bit lines BL1 and BL2 may be connected to the subsidiary lines SBL1 to SBL4 through an upper contact UCP penetrating the third upper interlayer dielectric layer 180. Each of the first upper interlayer dielectric layer 160, the second upper interlayer dielectric layer 170 and the third upper interlayer dielectric layer 180 may include one or more of a silicon oxide layer, a silicon nitride layer, a silicon oxynitride layer, and a low-k dielectric layer whose dielectric constant is lower than that of a silicon oxide layer. A metallic material such as tungsten or tungsten may be included in the lower contact LCP and the upper contact UCP, the subsidiary lines SBL1 to SBL4, and the bit lines BL1 and BL2. An upper wiring structure may be defined to include the first upper interlayer dielectric layer 160, the second upper interlayer dielectric layer 170 and the third upper interlayer dielectric layers 180, the lower contacts LCP and the upper contacts UCP, the subsidiary lines SBL1 to SBL4, and the bit lines BL1 and BL2.

According to embodiments of the present inventive concept, since the vertical channels VC are electrically connected to the substrate 100 through the first lower wiring pattern 152 and the second lower wiring pattern 154 formed on the substrate 100, it may omit a selective epitaxial growth process for connecting the vertical channels VC to the substrate 100 and a process for opening floor surfaces of vertical holes in which the vertical channels VC are provided. In addition, since the first lower wiring pattern 152 includes, in its longitudinal direction, portions having different widths from each other, process failure (e.g., un-etching or gap-fill defects) that may occur in forming the first lower wiring pattern 152 may be prevented or minimized, and reliability and electrical characteristics of semiconductor devices may be enhanced. This will be explained in detail through the following discussion about a method of fabricating a semiconductor device.

FIGS. 6A to 18A are cross-sectional views corresponding to line I-I' of FIG. 2 for explaining a method of fabricating a semiconductor device according to exemplary embodiments of the present inventive concept. FIGS. 6B to 18B are cross-sectional views corresponding to line II-II' of FIG. 2. FIGS. 14C to 17C are cross-sectional views corresponding to line III-III' of FIG. 2. FIG. 10C is a plan view for explaining a mask pattern used for a second ion implantation process. For brevity of the description, a repetitive description will be omitted.

Figure 6A:
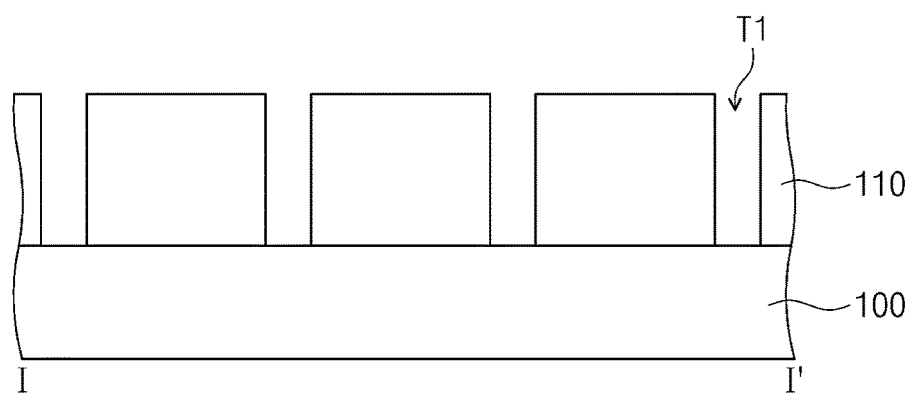
Figure 6B:
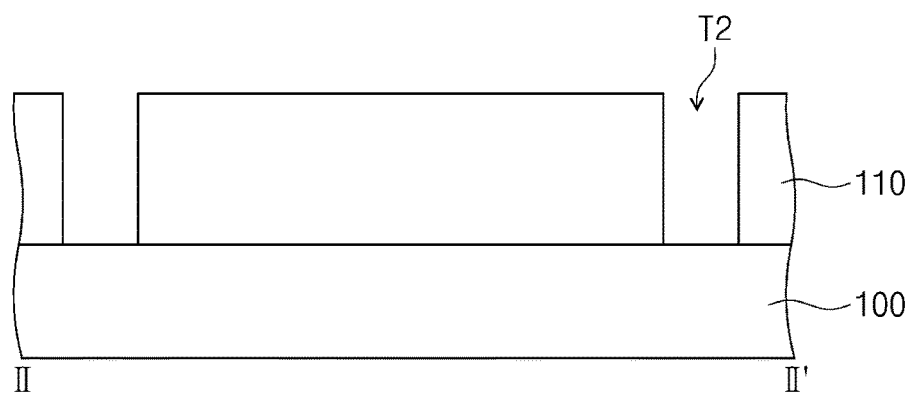

Referring to FIGS. 2, 6A, and 6B, a lower interlayer dielectric layer 110 is formed on a substrate 100. The substrate 100 may be a semiconductor substrate having a first conductivity, for example, a p-type conductivity. The lower interlayer dielectric layer 110 may be formed of, for example, silicon oxide or silicon nitride.

A first lower trench T1 and a second lower trench T2 are formed in the lower interlayer dielectric layer 110. The first lower trench T1 and the second lower trench T2 penetrate the lower interlayer dielectric layer 110 and expose the substrate 100. The first lower trench T1 and the second lower trench T2 are disposed in plural. The first lower trench T1 in plural is spaced apart from each other along a first direction D1. The first lower trench T1 extends in a second direction D2. The second lower trench T2 in plural is spaced apart from each other along the second direction D2. The second lower trench T2 extends in the first direction D1. The first trench T1 and the second trench T2 may cross each other to form a grid structure in a plan view, while being spatially connected to each other. The first lower trench T1 may include portions whose widths measured in the first direction D1 are different from each other. The width in the first direction D1 of the first lower trench T1 varies along the second direction D2. The second lower trench T2 has a substantially uniform width measured in the second direction D2. The first lower trench T1 may have widths corresponding to the first width W1 and the second width W2 of the first lower wiring pattern 152 discussed with reference to FIG. 5A, and likewise the second lower trench T2 may have a width corresponding to the third width W3 of the second lower wiring pattern 154 discussed with reference to FIG. 5B.

Figure 7A:
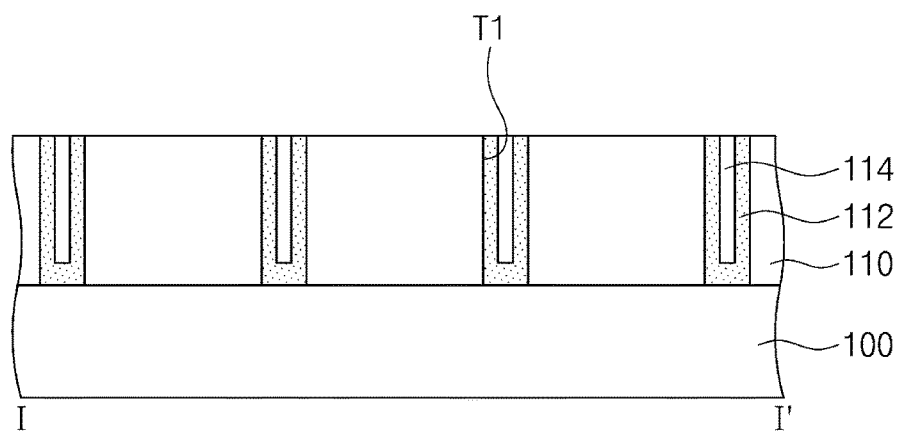
Figure 7B:
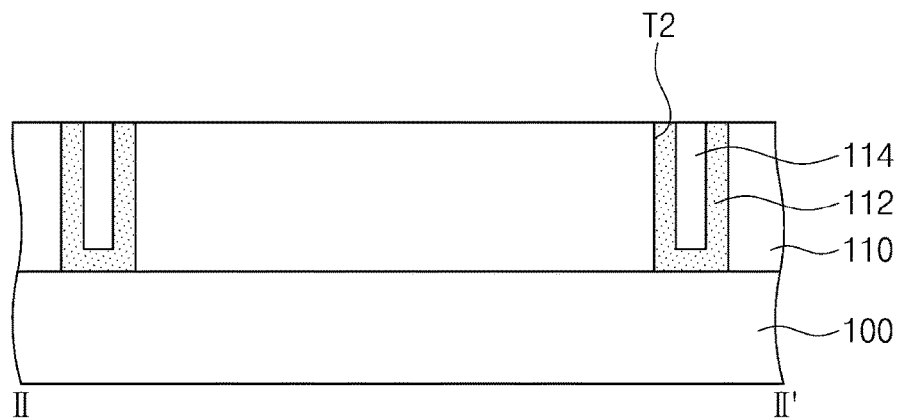

Referring to FIGS. 2, 7A, and 7B, a first conductive pattern 112 and a first sacrificial pattern 114 are formed in the first lower trench T1 and the second lower trench T2. The first conductive pattern 112 and the first sacrificial pattern 114 may be formed by sequentially forming on the substrate 100 a first conductive layer and a first sacrificial layer to completely fill the first lower trench T1 and the second lower trench T2 and then performing a planarization process to expose a top surface of the lower interlayer dielectric layer 110. For example, the first conductive layer may be formed of polysilicon, and the first sacrificial layer may be formed of silicon nitride. The planarization process may include a chemical mechanical polishing (CMP) process. The first conductive layer may be substantially conformally formed on inner sidewalls of the first lower trench T1 and the second lower trench T2. The first sacrificial layer in the first lower trench T1 may be formed to include portions whose widths measured in the first direction D1 are different along the second direction D2. In contrast, the first sacrificial layer in the second lower trench T2 may be formed to have a uniform width measured in the second direction D2.

Figure 8A:
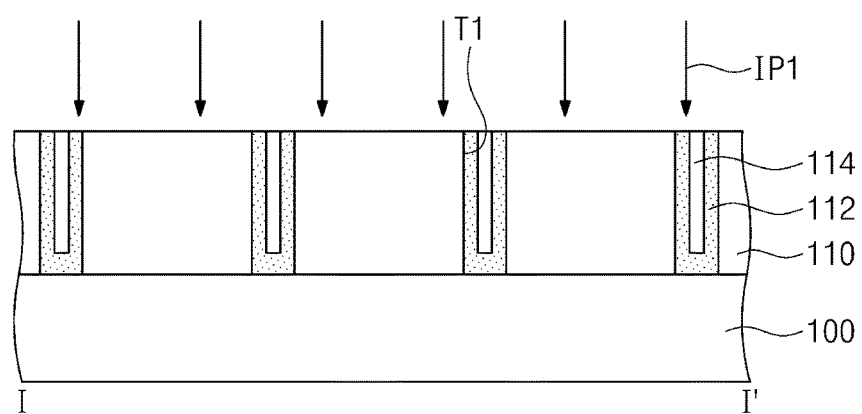
Figure 8B:
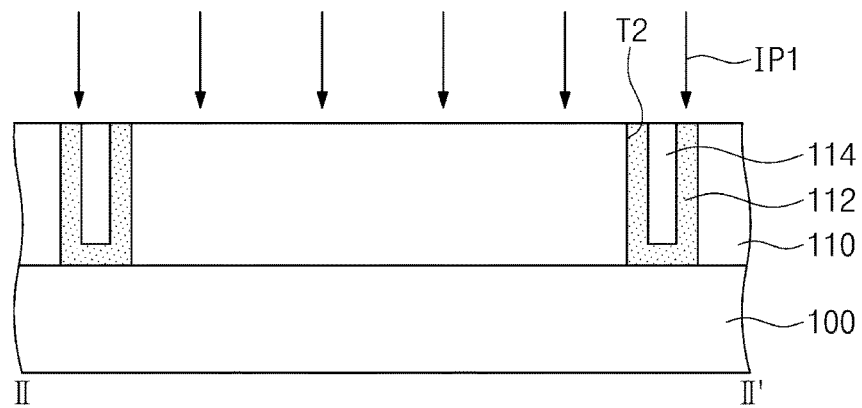

Referring to FIGS. 2, 8A, and 8B, a first ion implantation process IP1 is performed on an entire surface of the substrate 100. As a result, the first conductive pattern 112 may have an upper portion doped with an impurity. For example, carbon may be doped into the upper portion of the first conductive pattern 112. Since the first conductive pattern 112 includes carbon, an etching thereof may be prevented or minimized in a subsequent wet etching process on polysilicon. The wet etching process on polysilicon may be performed using an etchant including, for example, aqueous ammonia.

Figure 9A:
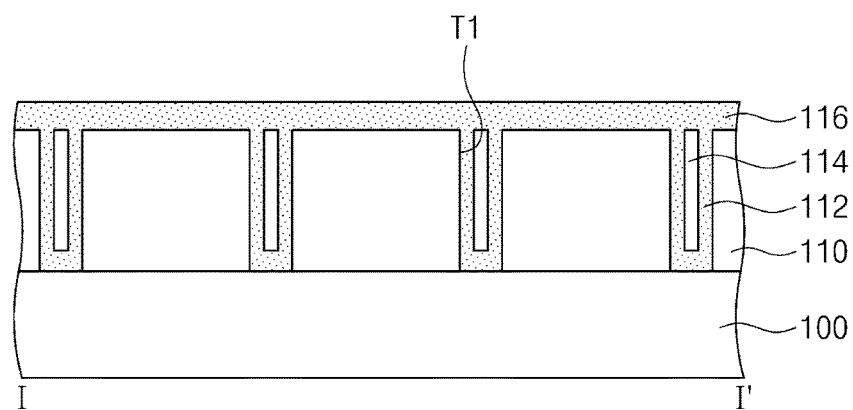
Figure 9B:
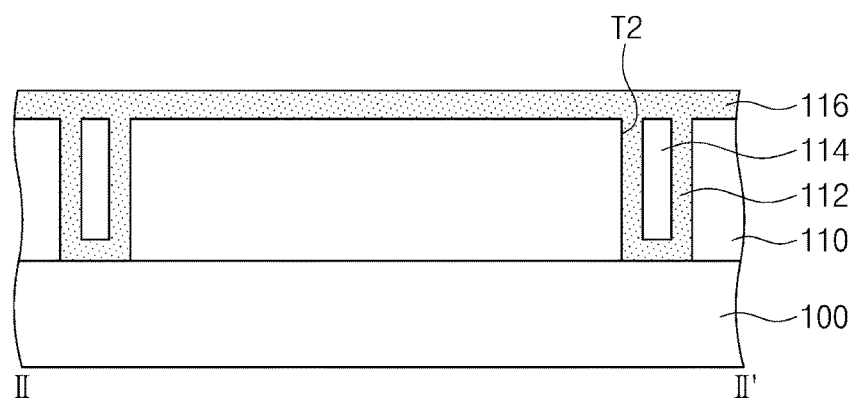
Figure 10A:
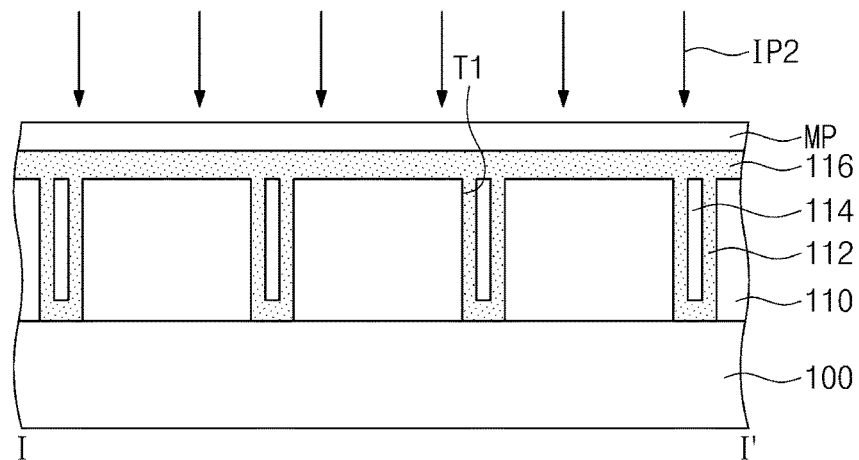
Figure 10B:
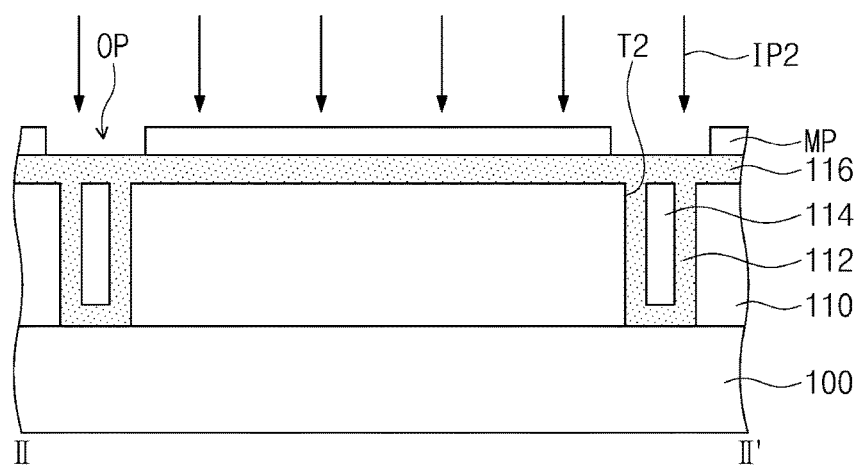
Figure 10C:
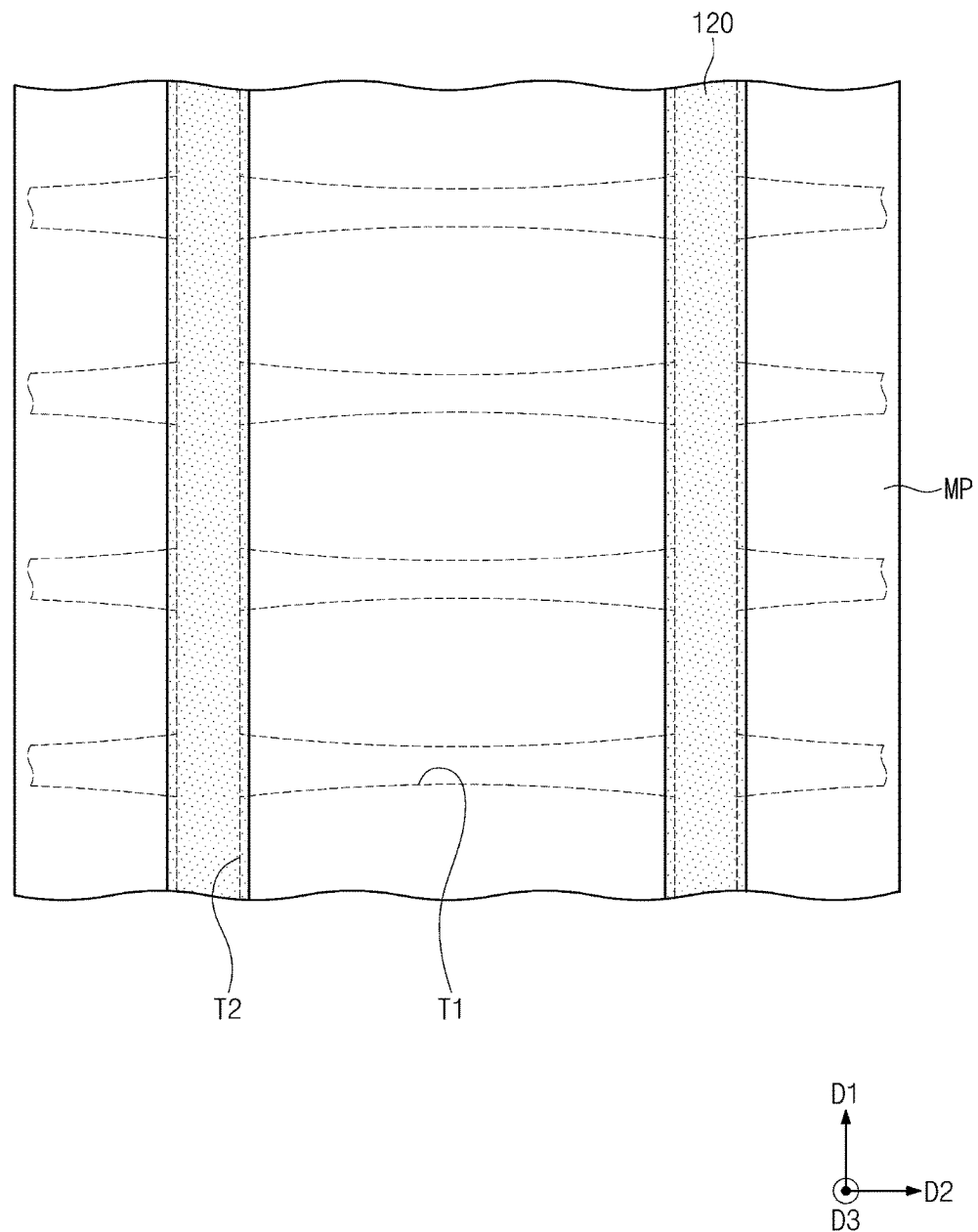
FIG. 10C is a plan view for explaining a mask pattern used for a second ion implantation process.

Referring to FIGS. 2, 9A, and 9B, a second conductive layer 116 is formed on the entire surface of the substrate 100. The second conductive layer 116 is connected to the first conductive pattern 112, covering top surfaces of the lower interlayer dielectric layer 110 and the first sacrificial pattern 114. The second conductive layer 116 may be formed of the same material as that of the first conductive layer. For example, the second conductive layer 116 may be formed of polysilicon.

Referring to FIGS. 2 and 10A to 10C, a mask pattern MP is formed on the second conductive layer 116. The mask pattern MP has an opening OP that exposes the second conductive layer 116 on the first conductive pattern 112. The opening OP is disposed in plural in the mask pattern MP. As viewed in plan, the opening OP may overlap the second lower trench T2. Although not shown, the opening OP in plural may be connected to each other at their ends to constitute a closed curve shape. The mask pattern MP may include, for example, photoresist.

A second ion implantation process IP2 using the mask pattern MP as a mask is performed to dope an impurity into a portion of an upper part of the second conductive layer 116 that is exposed through the opening OP. For example, carbon may be doped into the portion of the upper part of the second conductive layer 116 that is exposed through the opening OP. Since the second conductive layer 116 includes carbon at its upper portion, etching thereof may be prevented or minimized in a subsequent wet etching process on polysilicon.

Figure 11A:
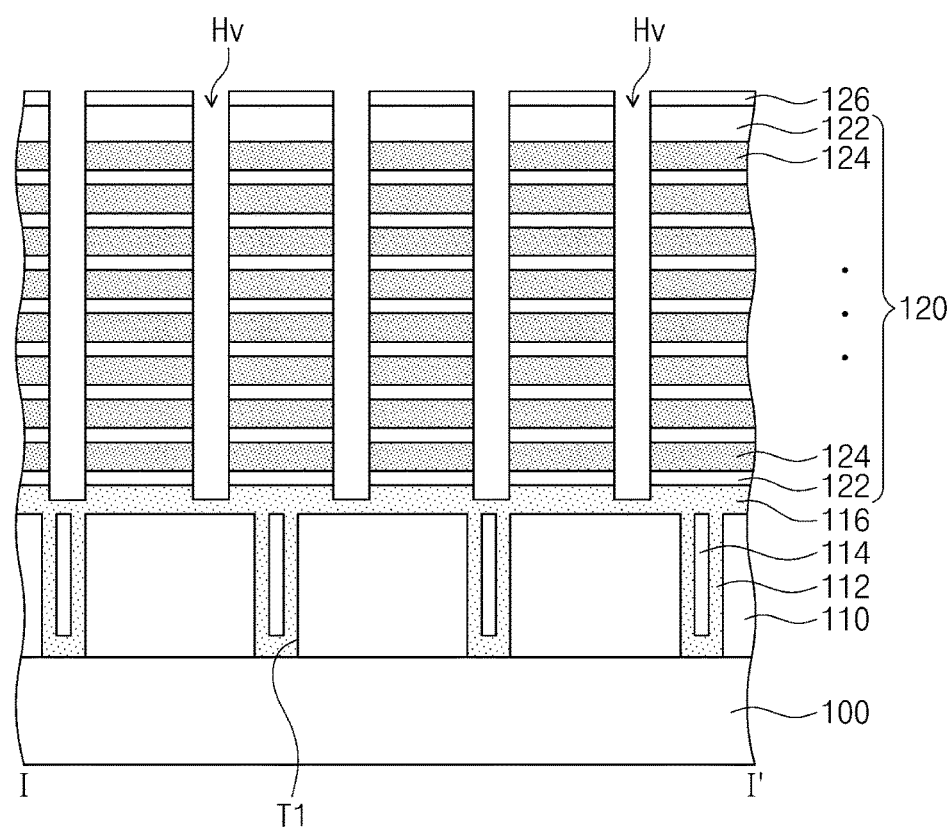
Figure 11B:
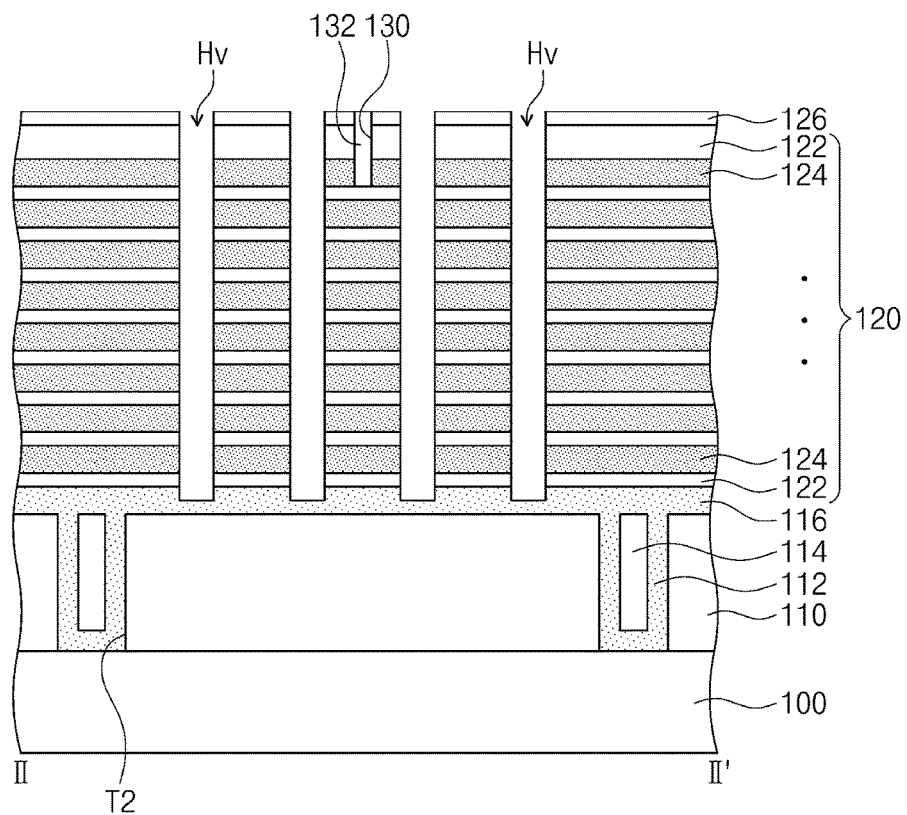

Referring to FIGS. 2, 11A, and 11B, the mask pattern MP is removed, and thereafter a plurality of insulation layers 122 and a plurality of second sacrificial layers 124 may be alternately and repeatedly stacked to form a thin-layer structure 120 on the second conductive layer 116. The second sacrificial layers 124 may be formed of a material having etch selectivity with respect to the insulation layers 122. For example, the second sacrificial layers 124 may exhibit a higher etch selectivity with respect to the insulation layers in a chemical solution for wet etching and a lower etch selectivity in an etching gas for dry etching.

For example, the second sacrificial layers 124 may include silicon, silicon oxide, silicon carbide, silicon germanium, silicon oxynitride, or silicon nitride, and may have a material different from that of the insulation layers 122. The insulation layers 122 may include silicon, silicon oxide, silicon carbide, silicon oxynitride, and silicon nitride, and may have a material different from those of the second conductive layer 116 and the second sacrificial layer 124. For example, the second conductive layer 116 may be formed of a polysilicon layer, the insulation layers 122 may be formed of a silicon oxide layer, and the second sacrificial layers 124 may be formed of a silicon nitride layer. Alternatively, the insulation layers 122 may be formed of an insulating material, and the second sacrificial layers 124 may be formed of a conductive material.

For example, the second sacrificial layers 124 may have the same thickness. Alternatively, lowermost and uppermost ones of the second sacrificial layers 124 may be formed thicker than other second sacrificial layers 124 positioned between the lowermost and uppermost ones of the second sacrificial layers 124. The insulation layers 122 may have the same thickness, or one or more of the insulation layers 122 may have a different thickness from those of other insulation layers 122.

Although not shown, the thin-layer structure 120 may be patterned to form stepwise structures at end portions thereof. The patterning of the thin-layer structure 120 may include alternately and repeatedly performing a process in which a mask pattern (not shown) is reduced in its horizontal area and a process in which the thin-layer structure 120 is anisotropically etched. The processes may be alternately and repeatedly performed such that end portions of the insulation layers 122 may be sequentially exposed along an ascending direction from the substrate 100. Thereafter, a buried insulation layer 126 is formed to cover the thin-layer structure 120. The buried insulation layer 126 is formed to have a planarized top surface.

A second separation region 130 may be formed to penetrate the buried insulation layer 126, an uppermost insulation layer of the insulation layers 122, and an uppermost second sacrificial layer of the second sacrificial layers 124. The second separation region 130 may have a trench shape extending in the first direction D1, and horizontally separate the uppermost second sacrificial layer of the second sacrificial layers 124. An insulating material may fill the second separation region 130 to form a separation insulation pattern 132. The separation insulation pattern 132 may include, for example, silicon oxide.

A plurality of vertical holes Hv are formed to penetrate the thin-layer structure 120 and expose a top surface of the second conductive layer 116. For example, the vertical holes Hv may be formed by forming a mask pattern (not shown) on the thin-layer structure 120 and performing an anisotropic etching process on the thin-layer structure 120 using the mask pattern as an etch mask. The anisotropic etching process may over-etch portions of the top surface of the second conductive layer 116, and thus the portions of the top surface of the second conductive layer 116 that are exposed through the vertical holes Hv are recessed to a predetermined depth. Differently from that shown in figures, the anisotropic etching process may cause the vertical holes Hv to have a lower width less than an upper width. As viewed in plan, the vertical holes Hv may be arranged in a zigzag fashion.

Figure 12A:
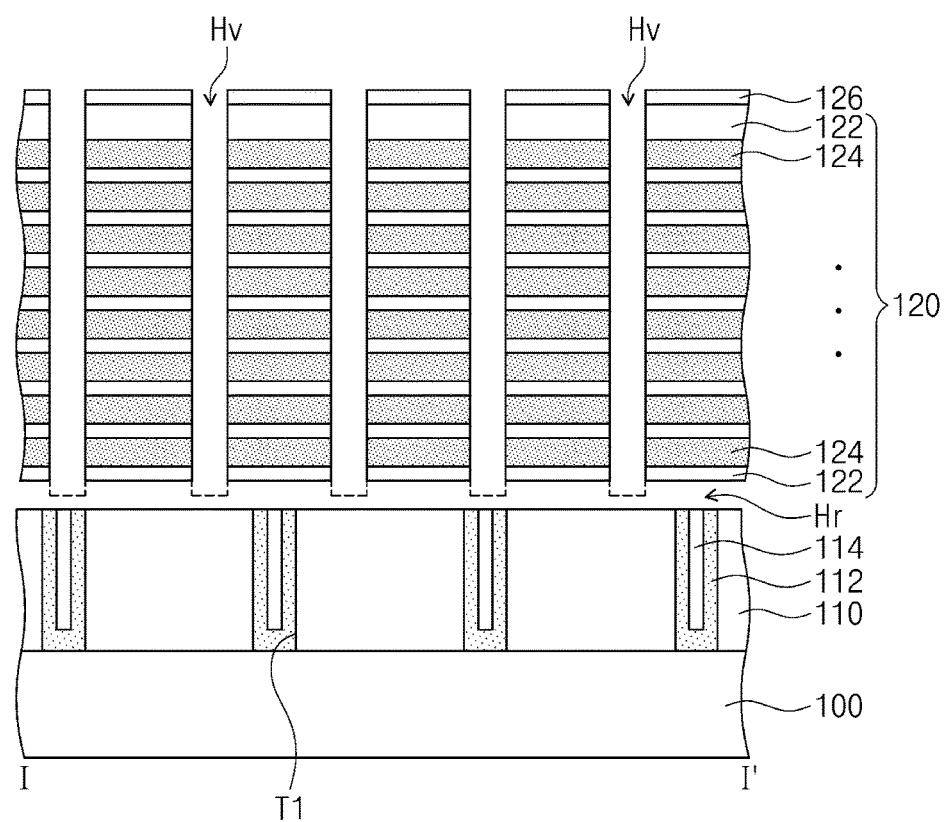
Figure 12B:
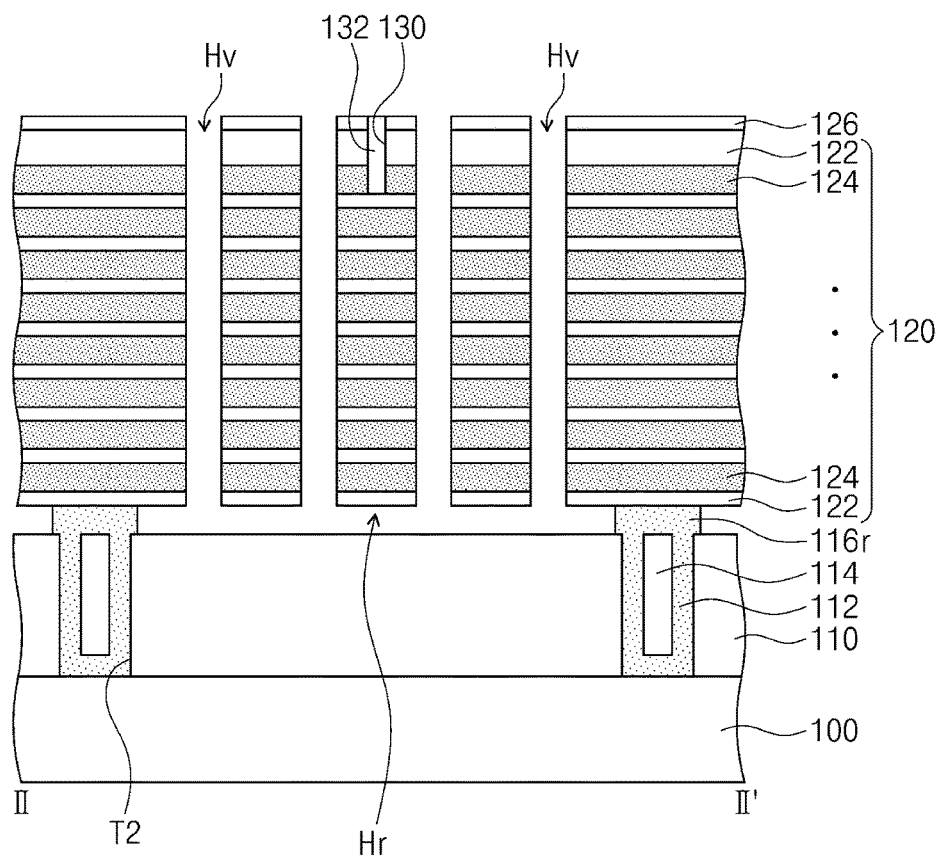

Referring to FIGS. 2, 12A, and 12B, a horizontal recess region Hr is formed by laterally etching portions of the second conductive layer 116 that are exposed through the vertical holes Hv. When the second conductive layer 116 is formed of polysilicon, the second conductive layer 116 may be removed using a wet etching process that uses an etchant including aqueous ammonia. During the wet etching process, the carbon-doped portions of the second conductive layer 116 remain. The remaining portion of the second conductive layer 116 may be referred to hereinafter as a residual second conductive layer 116r.

Figure 13A:
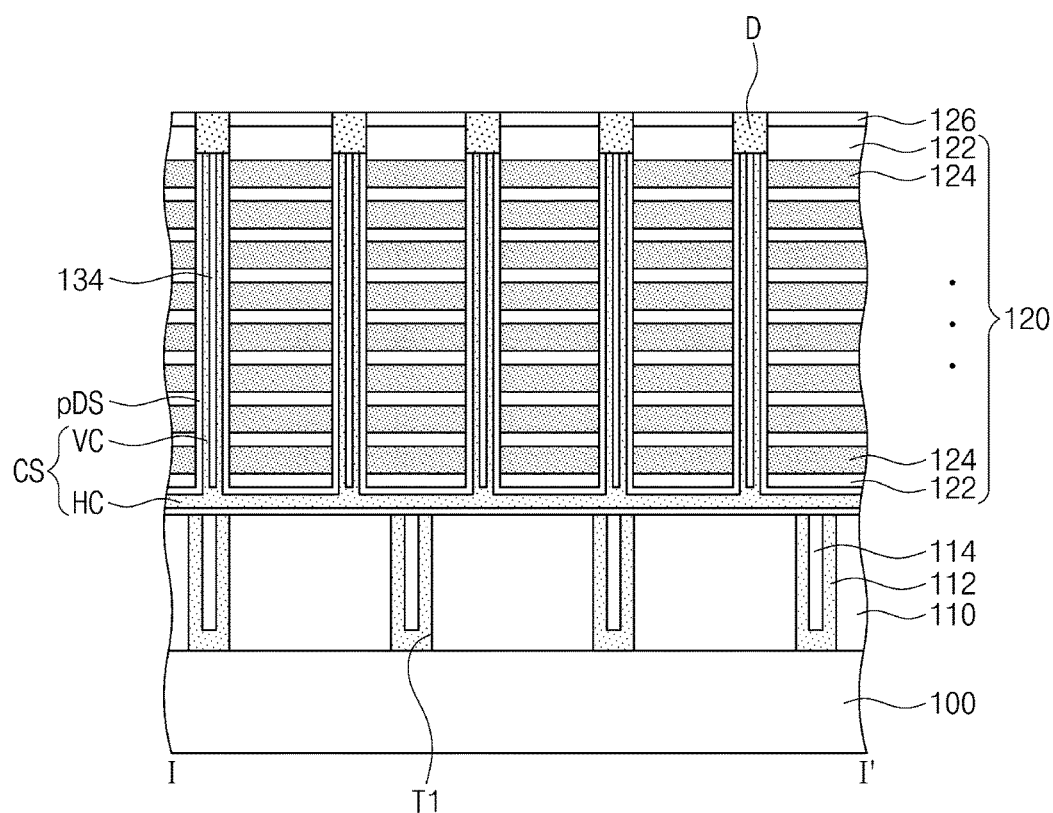
Figure 13B:
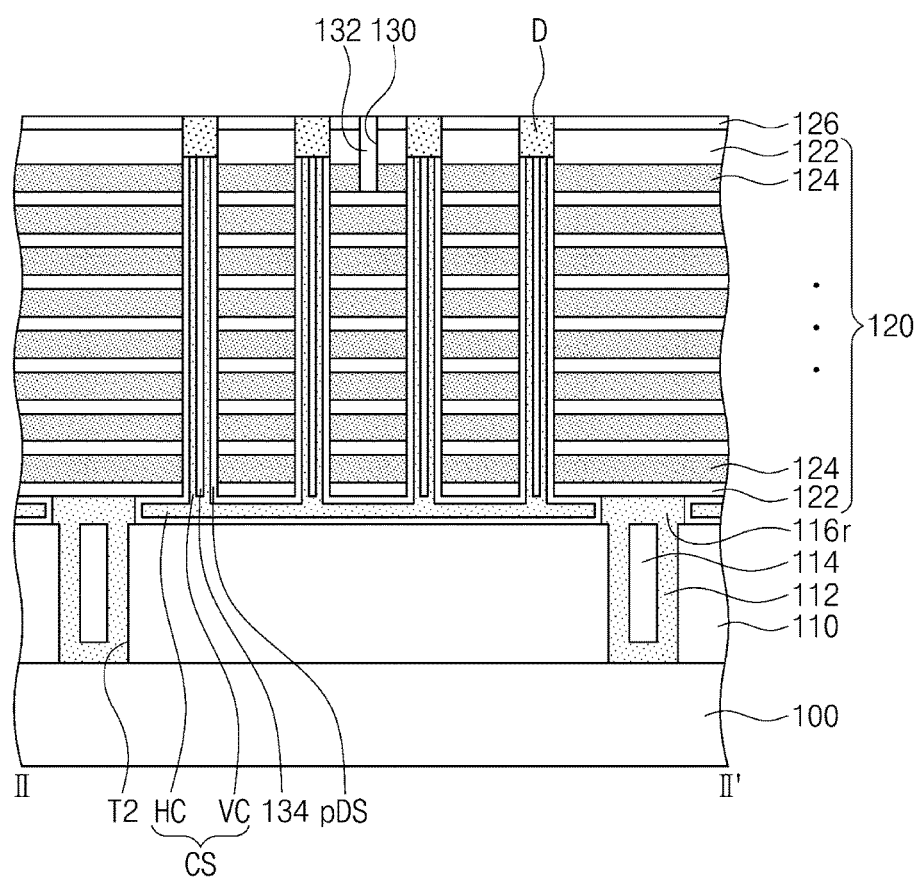
Figure 14A:
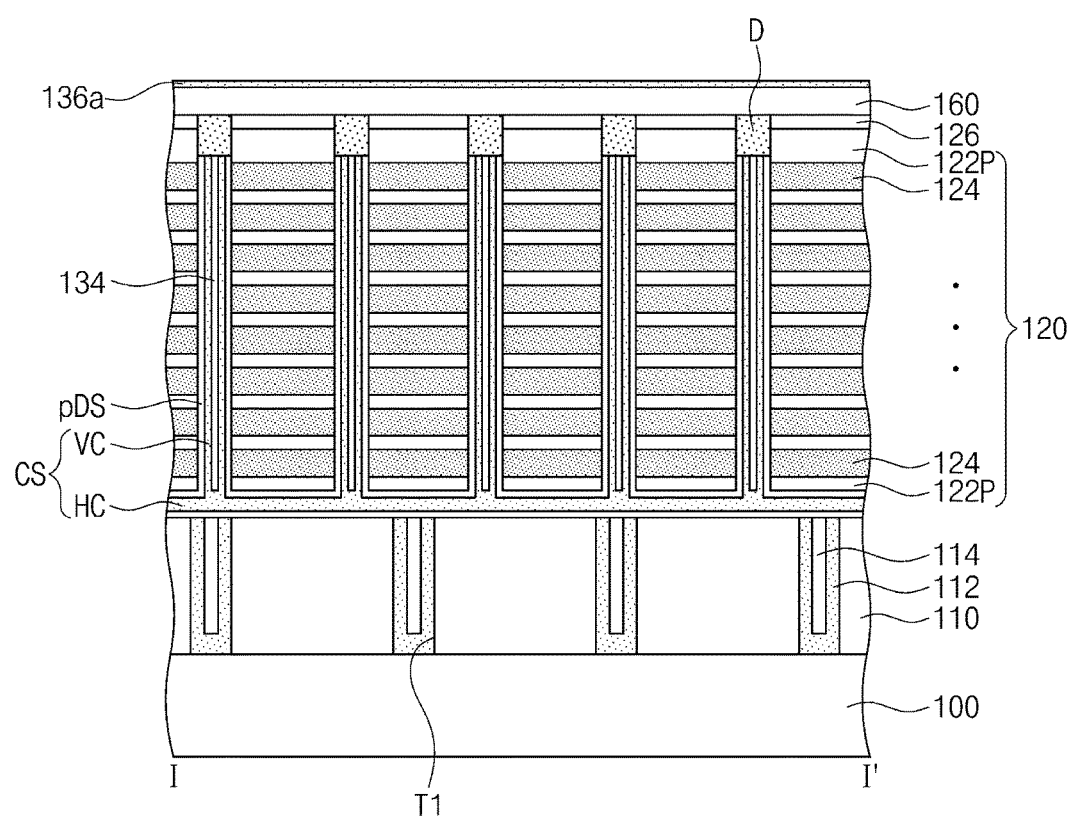
Figure 14B:
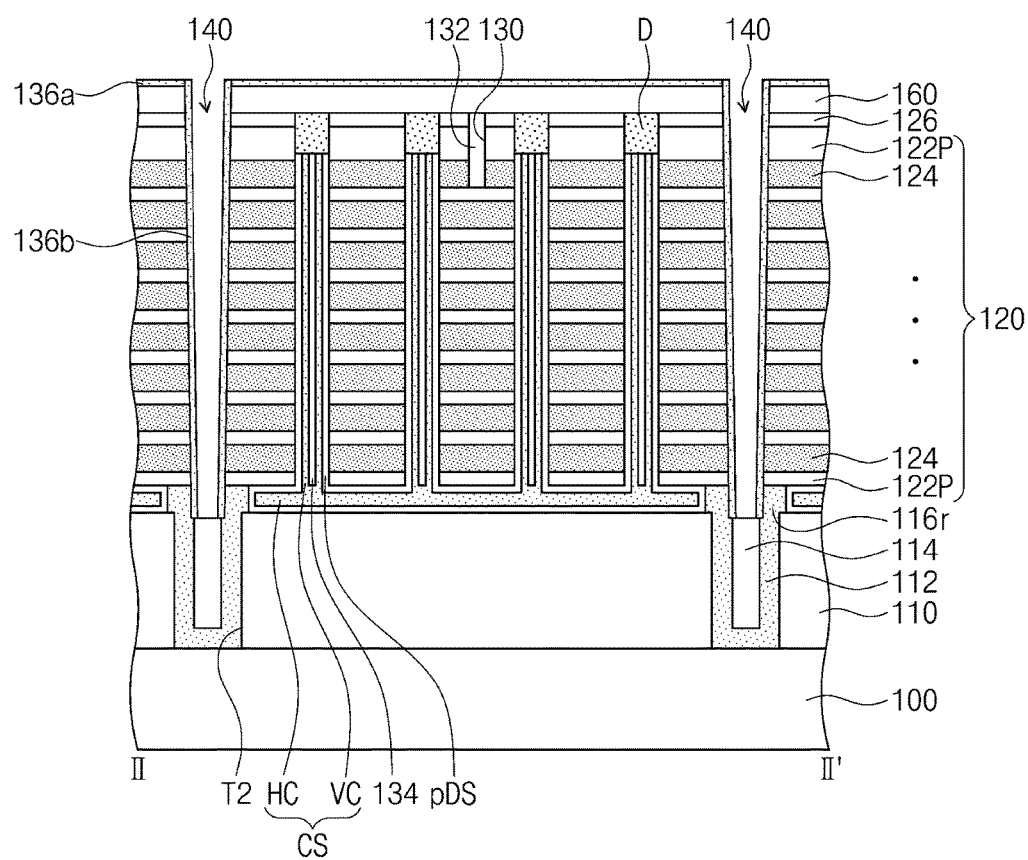
Figure 14C:
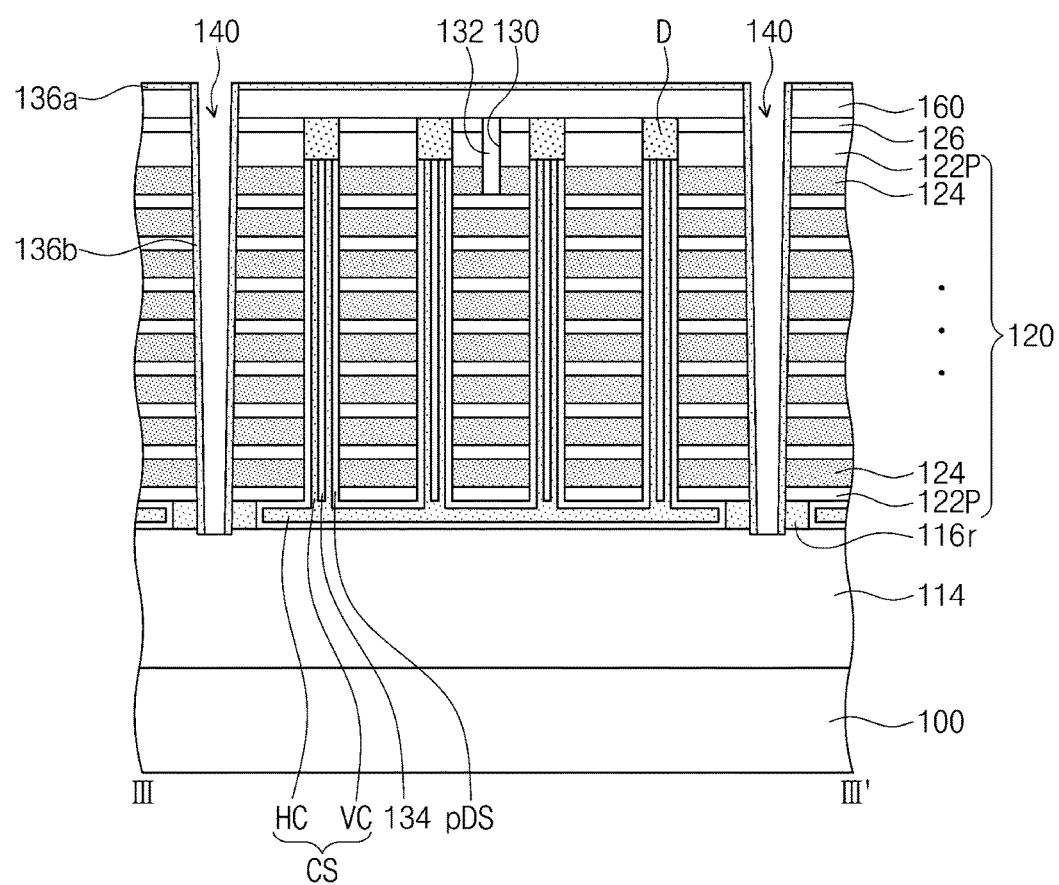
Figure 15A:
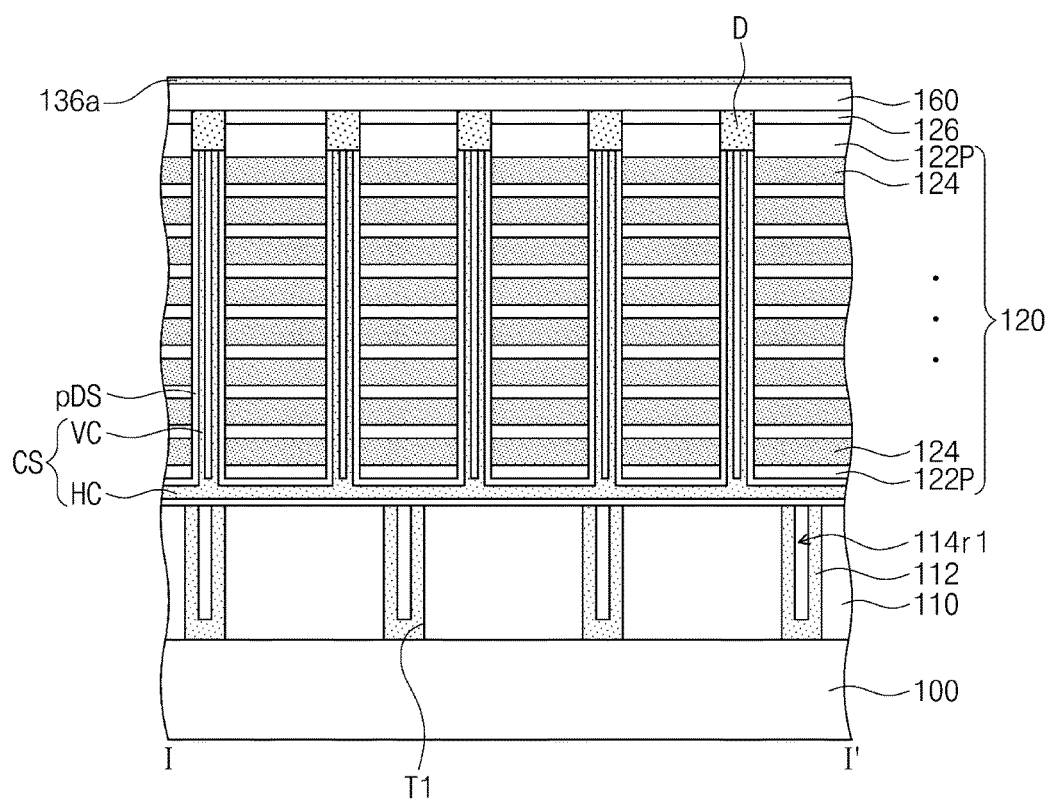
Figure 15B:
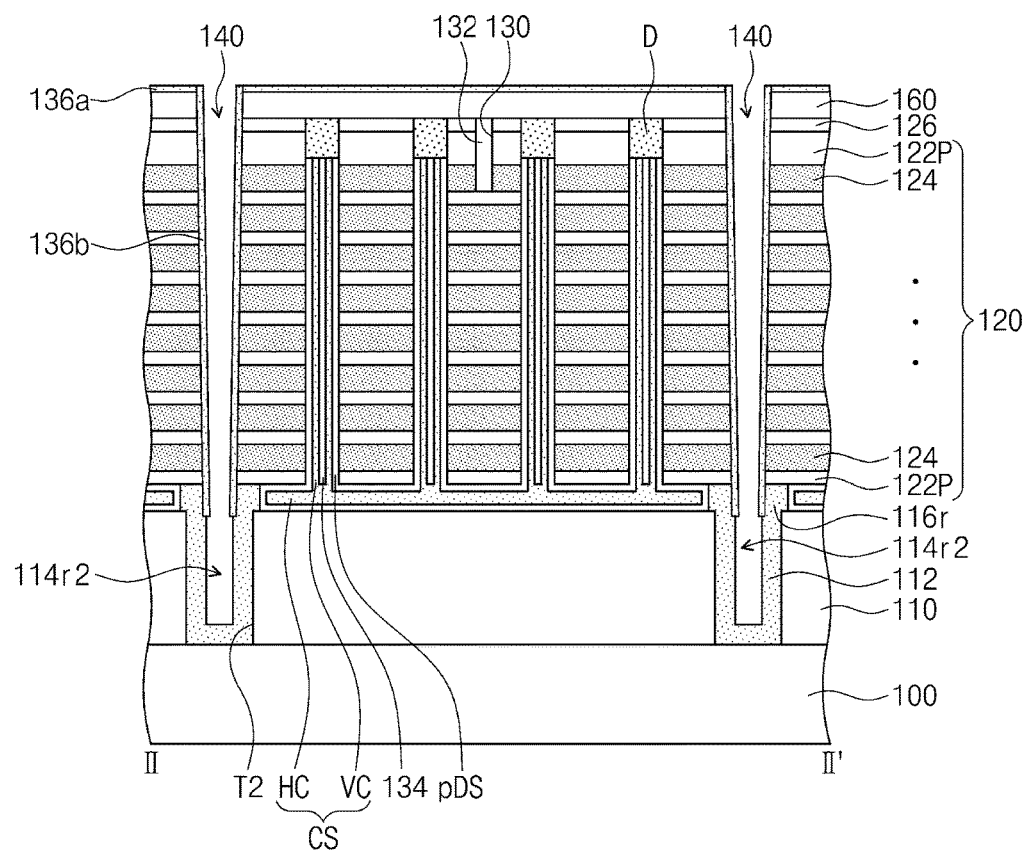
Figure 15C:
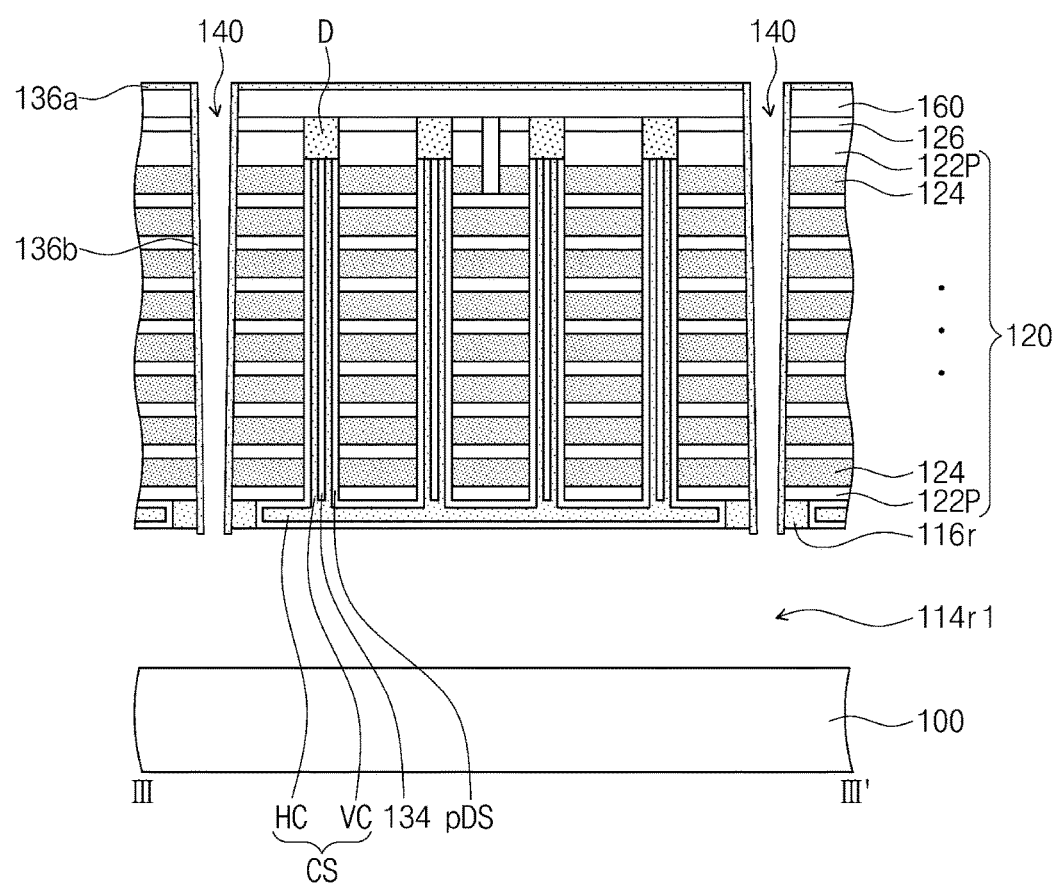
Figure 16A:
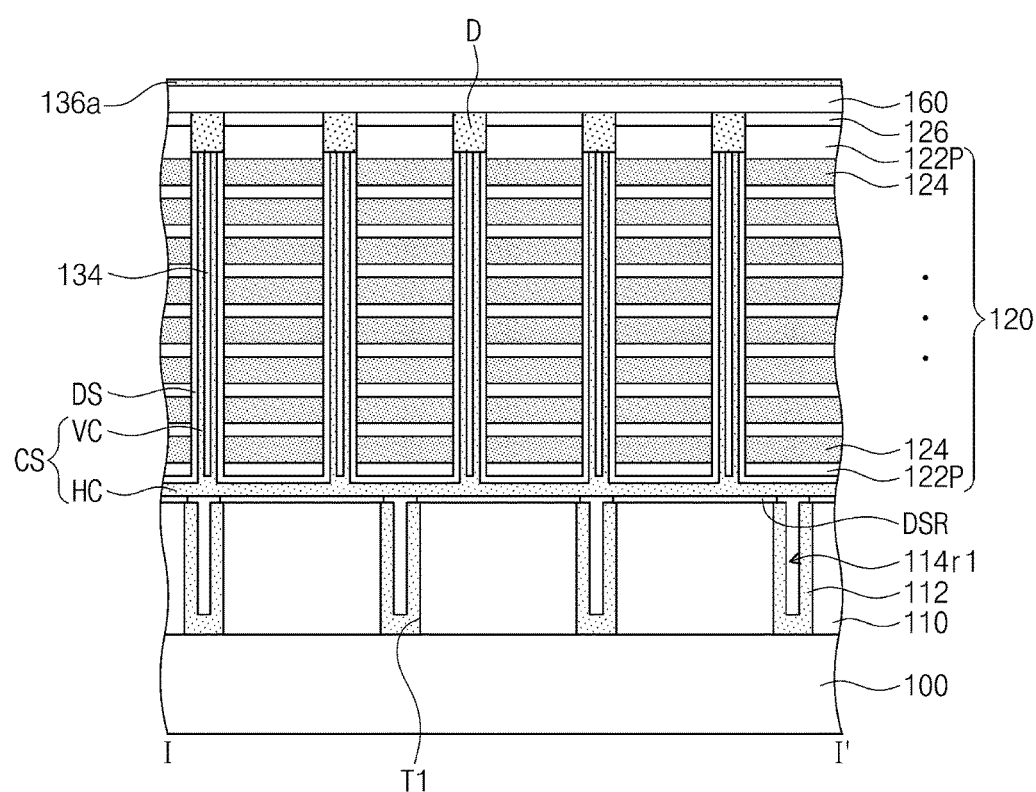
Figure 16B:
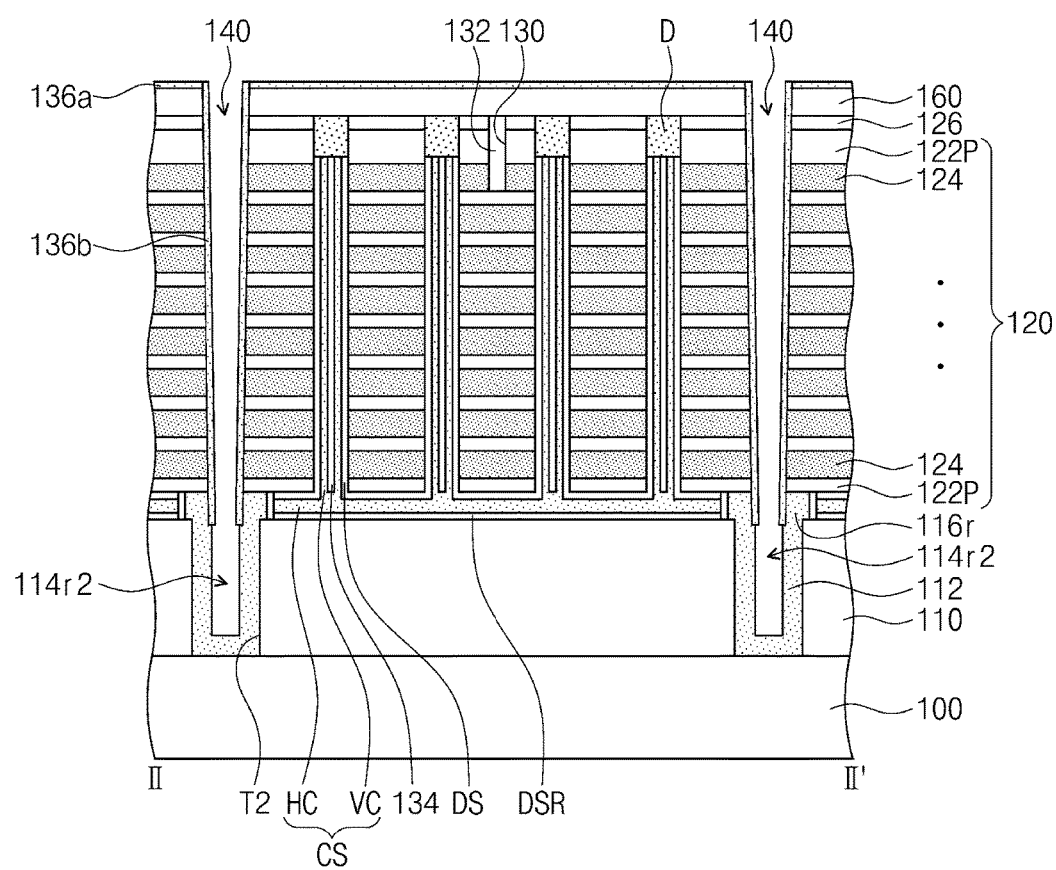
Figure 16C:
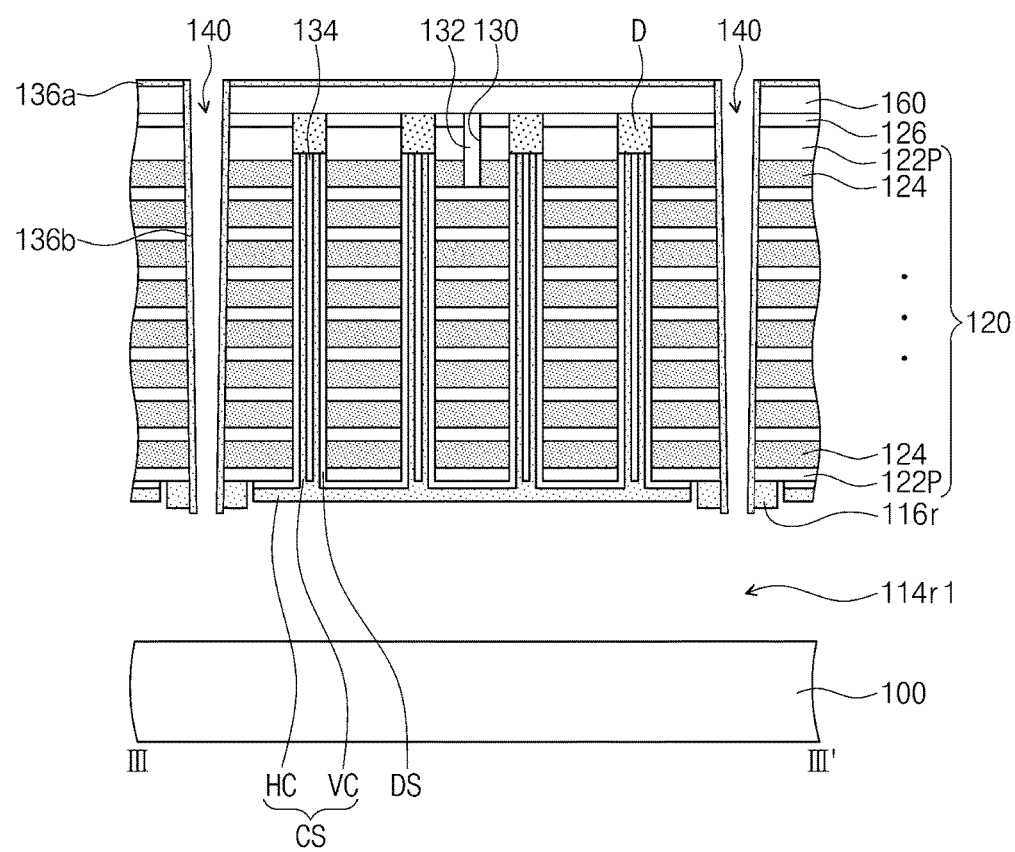
Figure 17A:
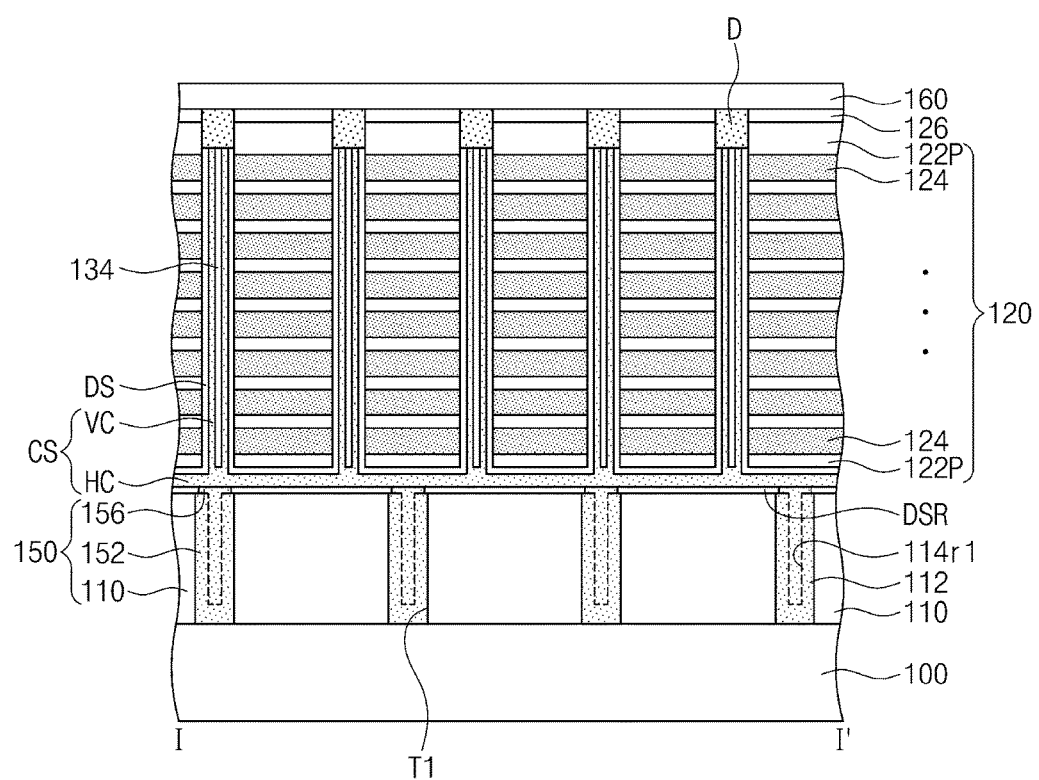
Figure 17B:
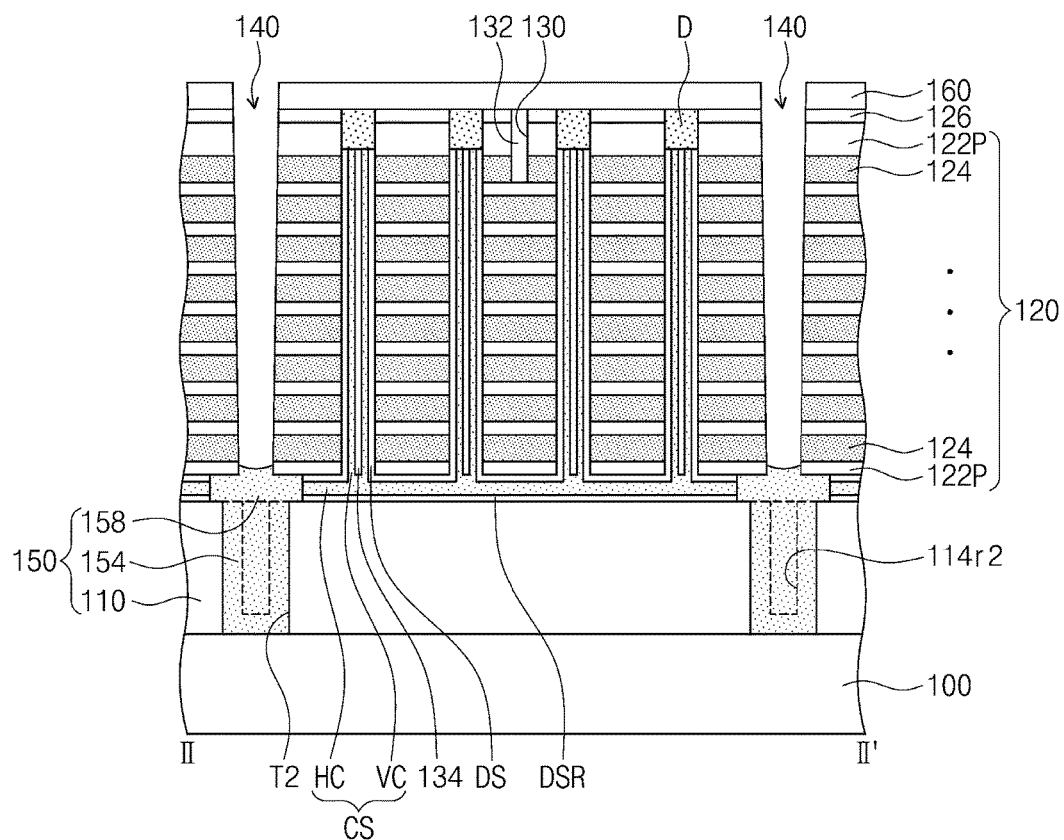
Figure 17C:
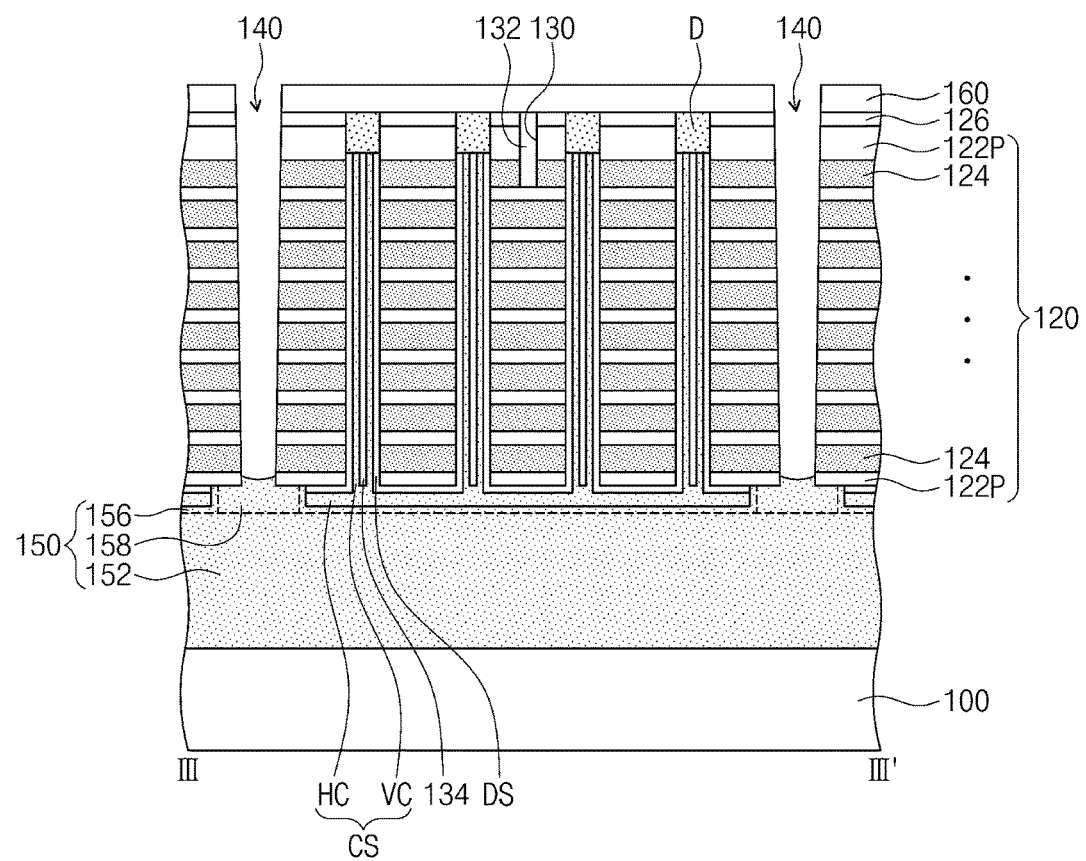

Referring to FIGS. 2, 13A, and 13B, a preliminary data storage pattern pDS and a channel structure CS may be sequentially formed in inner sidewalls of the vertical holes Hv and the horizontal recess region Hr. The channel structure CS includes vertical channels VC, which are formed on the inner sidewalls of the vertical holes Hv, and a horizontal channel HC, which extends toward bottom ends of the vertical channels VC to fill the horizontal recess region Hr. A filling insulation pattern 134 may be formed in inside portions of the vertical channels VC.

In some embodiments, the formation of the preliminary data storage pattern pDS, the channel structure CS, and the filling insulation pattern 134 may include sequentially forming on the substrate 100 a preliminary data storage layer, a semiconductor layer, and a filling insulation layer to fill the vertical holes Hv and the horizontal recess region Hr and then removing the preliminary data storage layer, the semiconductor layer, and the filling insulation layer on the thin-layer structure 120 by a planarization process exposing the buried insulation layer 126.

The preliminary data storage layer may be formed of a single thin layer or a plurality of thin layers. For example, the preliminary data storage layer may include a tunnel insulation layer, a charge storage layer, and a blocking insulation layer, which are sequentially stacked. The preliminary data storage layer may be formed to have a uniform thickness on the inner sidewalls of the vertical holes Hv and the inner sidewalls of the horizontal recess region Hr. For example, the preliminary data storage layer may extend from the inner sidewalls of the vertical holes Hv onto a bottom surface of the thin-layer structure 120 and a top surface of the lower interlayer dielectric layer 110. The semiconductor layer may include silicon (Si), germanium (Ge), or a mixture thereof. The semiconductor layer may be an impurity-doped semiconductor or an impurity-undoped intrinsic semiconductor. The semiconductor layer may include a single crystalline structure, an amorphous structure, or a polycrystalline structure. The semiconductor layer may have a hollow pipe or macaroni shape in the vertical holes Hv, and completely fill the horizontal recess region Hr. The present inventive concept, however, is not limited thereto. The filling insulation layer may include, for example, a silicon oxide layer. The preliminary data storage layer, the semiconductor layer, and the filling insulation layer may be formed using a chemical vapor deposition (CVD) process or an atomic layer deposition (ALD) process.

A plurality of conductive pads D is formed at or on upper ends of the vertical channels VC. The conductive pads D may be formed by recessing upper portions of the vertical channels VC to form recessed regions and then filling the recess regions with a conductive material. The conductive pads D may be doped with an impurity whose conductivity is different from that of the vertical channel VC under the conductive pads D. Therefore, the conductive pads D and their underlying parts (the vertical channels VC, for example) may constitute diodes.

Referring to FIGS. 2 and 14A to 14C, a first upper interlayer dielectric layer 160 is formed on the thin-layer structure 120. The first upper interlayer dielectric layer 160, the buried insulation layer 126, and the thin-layer structure 120 may be sequentially etched to form first separation regions 140 through which the first conductive pattern 112 and the first sacrificial pattern 114 are exposed. The first separation regions 140 have a trench shape extending in the first direction D1, and are separated from each other in the second direction D2. A first protective pattern 136a and a second protective pattern 136b are formed respectively on a top surface of the first upper interlayer dielectric layer 160 and sidewalls of the first separation regions 140.

The formation of the first separation regions 140 and the first protective pattern 136a and the second protective pattern 136b may include forming a first protective layer on the first upper interlayer dielectric layer 160, performing an anisotropic etching process using an etch mask to form the first separation regions 140, forming a second protection layer on a top surface of the first protective layer and on inner sidewalls of the first separation regions 140, and performing an etch-back process to remove the second protective layer on the first protective layer and on floor surfaces of the first separation regions 140. As a result, the first protective layer may remain on the first upper interlayer dielectric layer 160 to form the first protective pattern 136a, and the second protective layer may remain on the sidewalls of the first separation regions 140 to form the second protective pattern 136b. The first and second protective layers may be formed of, for example, polysilicon. The first protective pattern 136a and the second protective pattern 136b may protect the second sacrificial layers 124 from being etched when the first sacrificial pattern 114 is removed in a subsequent process. The anisotropic etching process may cause the first separation regions 140 to have inclined sidewalls. Insulation patterns 122P may be defined to refer to the insulation layers 122 that have been patterned during the formation of the first separation regions 140.

Referring to FIGS. 2 and 15A to 15C, the first sacrificial pattern 114 exposed through the first separation regions 140 is selectively removed to form a first lower recess region 114r1 and a second lower recess region 114r2. A wet etching process may be used to selectively remove the first sacrificial pattern 114. The first lower recess region 114r1 is formed by removal of the first sacrificial pattern 114 in the first lower trench T1, and the second lower recess region 114r2 is formed by removal of the first sacrificial pattern 114 in the second lower trenches T2.

The first sacrificial pattern 114 formed in a single body within the first lower trench T1 and the second lower trench T2 may be completely removed by an etchant attack through the first separation regions 140. The etchant attack may be easily launched on the first sacrificial pattern 114 positioned directly under the first separation regions 140, so that the attacked first sacrificial pattern 114 may be completely removed from the second lower trenches T2. In contrast, an etchant attack may be hardly launched on portions of the first sacrificial pattern 114 that are provided in the first lower trench T1 far away from the first separation regions 140, so that the non-attacked portions of the first sacrificial pattern 114 may remain in the first lower trench T1. For example, the first sacrificial pattern 114 may have un-etched portions in the first lower trench T1. According to embodiments of the present inventive concept, the first sacrificial pattern 114 in the first lower trenches T1 may be formed to have portions, which are positioned far away from the first separation regions 140 and have widths less than those of other portions positioned closer to the first separation regions 140. Therefore, even a small amount of an etchant may completely remove the portions of the first sacrificial pattern 114 that are positioned far away from the first separation regions 140. As a result, it may be possible to prevent or suppress occurrence of the un-etching failure discussed above.

Referring to FIGS. 2 and 16A to 16C, the preliminary data storage pattern pDS exposed through the first lower recess regions 114r1 is partially removed. Hence, the preliminary data storage pattern pDS may transform into a data storage pattern DS and a residual data storage pattern DSR that are spaced apart from each other. The data storage pattern DS is disposed between the thin-layer structure 120 and the vertical channels VC, extending to a region between the horizontal channel HC and a bottom surface of the thin-layer structure 120. The residual data storage pattern DSR is interposed between the horizontal channel HC and the lower interlayer dielectric layer 110, and spaced apart from the data storage pattern DS.

Referring to FIGS. 2 and 17A to 17C, a conductive material may be provided through the first separation regions 140 to form a third conductive layer in the first lower recess region 114r1 and the second lower recess region 114r2 and in an empty space where the preliminary data storage pattern pDS is removed. The third conductive layer may be formed to fill the first lower recess region 114r1 and the second lower recess region 114r2, and the empty space where the preliminary data storage pattern pDS is removed, and to cover a top surface of the first protective pattern 136a and sidewalls of the second protective pattern 136b. The third conductive layer may be formed of, for example, polysilicon.

An etching process may be performed to remove the third conductive layer and the second protective pattern 136b in the first separation regions 140. The etching process may be performed until exposing partially a sidewall of the lowermost insulation pattern of the insulation patterns 122P. Therefore, the sidewalls of the second sacrificial layers 124 are exposed through the first separation regions 140, and simultaneously a lower wiring structure 150 may be eventually formed.

For example, a first lower wiring pattern 152 may be constituted by the third conductive layer filling the first lower recess region 114r1 and the first conductive pattern 112 in the first lower trenches T1. According to embodiments of the present inventive concept, the first lower recess region 114r1 may be formed to have portions, which are positioned far away from the first separation regions 140 and have widths less than other portions closer to the first separation regions 140. Therefore, the third conductive layer may easily fill the portions of the first lower recess region 114r1 that are positioned far away from the first separation regions 140. A second lower wiring pattern 154 may be constituted by the third conductive layer that fills second lower recess regions 114r2 and the first conductive pattern 112 in the second lower trenches T2. A first connecting conductive pattern 156 is constituted by the third conductive layer filling the empty space where the preliminary data storage pattern pDS is removed. A second connecting conductive pattern 158 is constituted by the residual second conductive layer 116r, the second protective pattern 136b remaining in the first separation regions 140 after the etching process, and the third conductive layer remaining in the first separation regions 140 after the etching process. The first protective pattern 136a may be completely removed during the etching process.

Figure 18A:
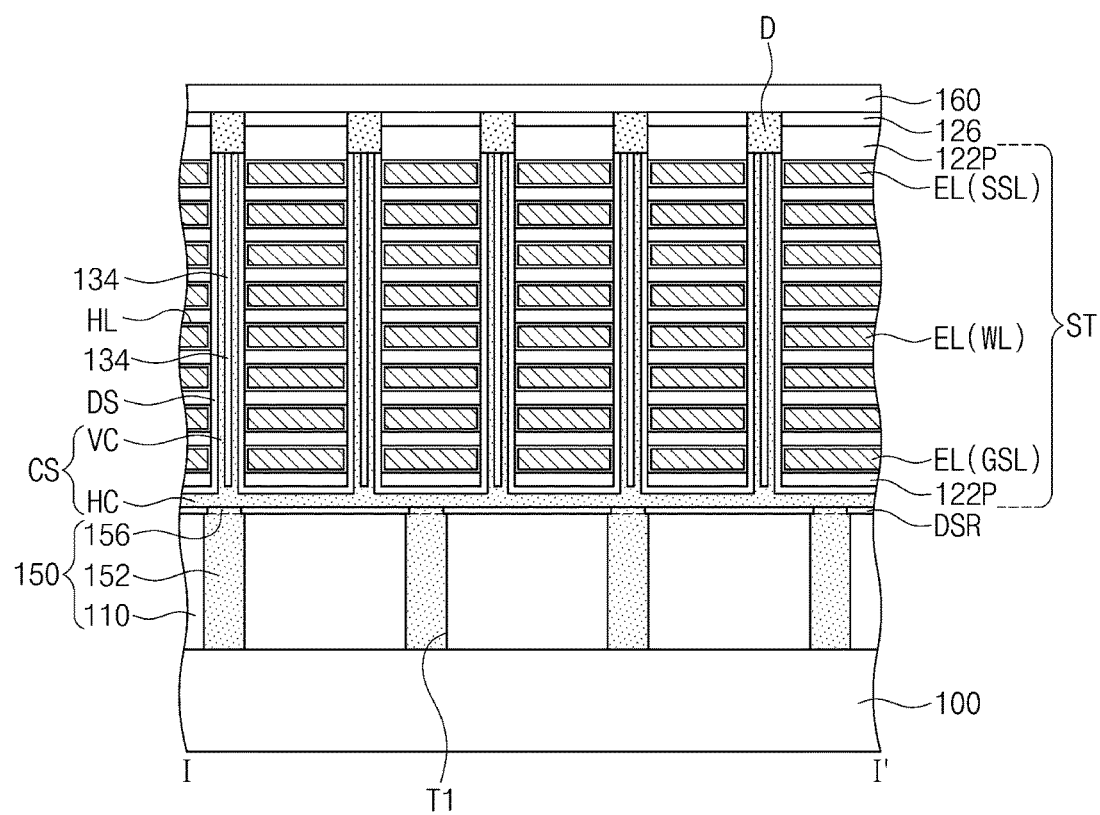
Figure 18B:
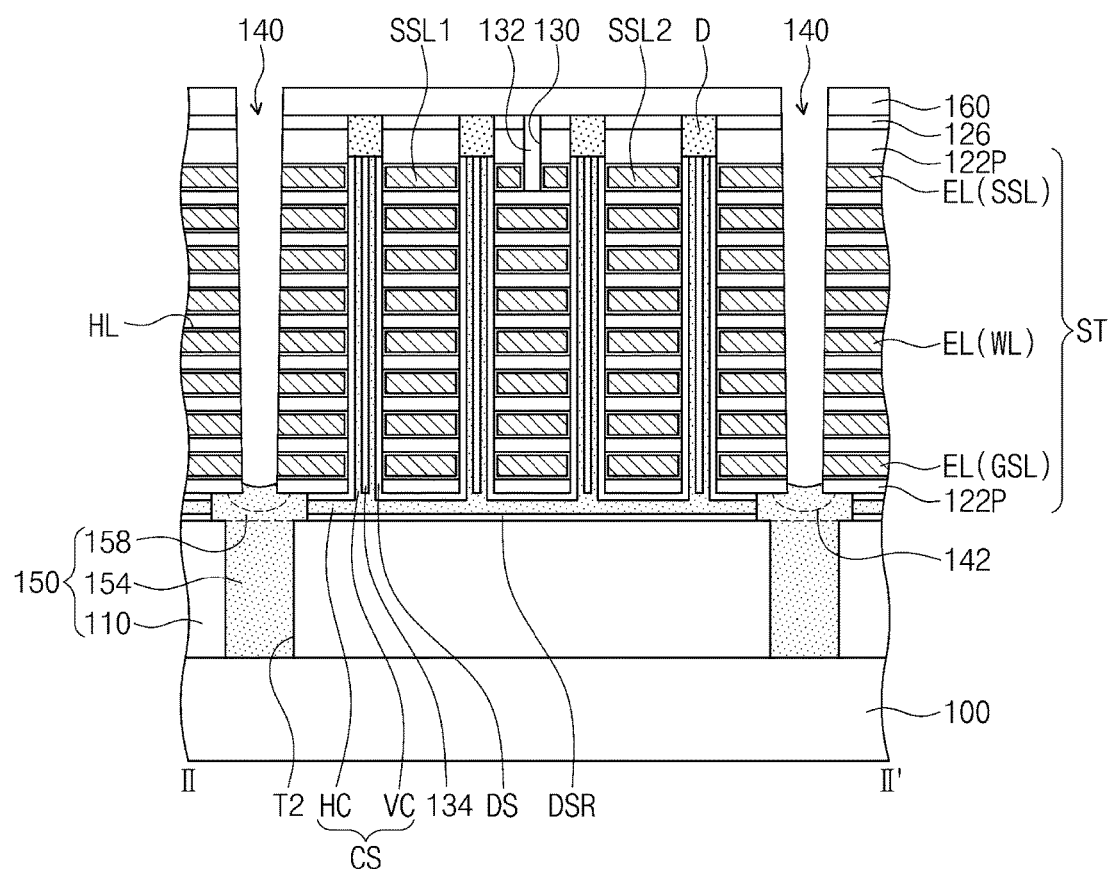

Referring to FIGS. 2, 18A, and 18B, gate regions may be formed by selectively removing the second sacrificial layers 124 exposed through the first separation regions 140, and then horizontal insulation patterns HL and gate electrodes EL may be sequentially formed in the gate regions. An isotropic etching process may be used to selectively remove the second sacrificial layers 124. For example, when the second sacrificial layers 124 are silicon nitride layers and the insulation patterns 122P are silicon oxide layers, the etching process may be performed using an etchant including phosphoric acid. The horizontal insulation patterns HL may be formed to have a substantially uniform thickness on inner sidewalls of the gate regions. The horizontal insulation patterns HL may be composed of a single thin layer or a plurality of thin layers. For example, the horizontal insulation patterns HL may be used as a blocking insulation layer of a charge-trap flash memory transistor. The gate electrodes EL may include doped semiconductor (e.g., doped silicon, etc.), metal (e.g., tungsten), conductive metal nitride (e.g., titanium nitride, tantalum nitride, or tungsten nitride), or transition metal (e.g., titanium or tantalum). Since the gate electrodes EL are formed, stack structures ST may be formed to include the insulation patterns 122P and the gate electrodes EL that are alternately and repeatedly stacked on the substrate 100. The stack structures ST may extend in the first direction D1 and be spaced apart from each other in the second direction D2.

Common source regions 142 may be formed at or on upper portions of the second connecting conductive patterns 158 exposed through the first separation regions 140. The common source regions 142 may be formed by doping the second connecting conductive patterns 158 with an impurity having a second conductivity different from that of the substrate 100. The common source regions 142 may extend in the first direction D1.

Referring back to FIGS. 2 and 3A to 3C, insulation spacers 144 and common source plugs 146 may be sequentially formed in the first separation regions 140. For example, the insulation spacers 144 may be formed of a silicon oxide layer or a silicon nitride layer. The common source plugs 146 may be formed of one or more of metal (e.g., tungsten) and conductive metal nitride (e.g., titanium nitride, tantalum nitride, or tungsten nitride). The common source plugs 146 may be formed to have a linear shape extending in the first direction D1, but embodiments of the present inventive concept are not limited thereto.

Second upper interlayer dielectric layers 170 and third upper interlayer dielectric layers 180 may be formed on the first upper interlayer dielectric layer 160, and lower contacts LCP, subsidiary lines (see SBL1 to SBL4 of FIG. 5C), and upper contacts UCP may be formed in the first upper interlayer dielectric layers 160, the second upper interlayer dielectric layers 170 and the third upper interlayer dielectric layers 180. A metallic material such as tungsten or tungsten may be used to form the lower and upper contacts LCP and UCP and the subsidiary lines SBL1 to SBL4. In some embodiments, a damascene process may be employed to form the lower contacts LCP, the subsidiary lines SBL1 to SBL4, and the upper contacts UCP. Bit lines BL1 and BL2 may be formed on the third upper interlayer dielectric layer 180. Through the processes, a semiconductor device may be eventually fabricated.

According to embodiments of the present inventive concept, since the vertical channels have structures electrically connected to the substrate through the lower wiring patterns formed on the substrate, it may be possible to omit a selective epitaxial growth process for connecting the vertical channels to the substrate and a process for opening floor surfaces of vertical holes in which the vertical channels are provided. Moreover, since the first lower wiring patterns are embodied to include portions having different widths from each other along their longitudinal directions, it may be possible to prevent or minimize failure (e.g., un-etching or gap-fill defects) that can be occurred in forming the first lower wiring patterns and thereby to enhance reliability and electrical characteristics of semiconductor devices.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor device, comprising:
   a substrate;
   a stack structure including a plurality of gate electrodes vertically stacked on the substrate and extending in a first direction;
   a channel structure including a plurality of vertical channels penetrating the stack structure and a horizontal channel connecting the plurality of vertical channels, the horizontal channel being provided under the stack structure; and
   a plurality of first lower wiring patterns disposed between the substrate and the stack structure and electrically connected to the channel structure,
   wherein each of the plurality of first lower wiring patterns comprises a first portion and a second portion having different widths from each other in the first direction.

2. The semiconductor device of claim 1,
   wherein each of the plurality of first lower wiring patterns extends in a second direction crossing the first direction and runs across the stack structure in the second direction, and
   wherein a width of the second portion is smaller than a width of the first portion.

3. The semiconductor device of claim 2,
   wherein each of the plurality of first lower wiring patterns has a width that gradually decreases in the second direction from the first portion to the second portion.

4. The semiconductor device of claim 2,
   wherein each of the plurality of first lower wiring patterns has a width that stepwise decreases in the second direction from the first portion to the second portion.

5. The semiconductor device of claim 2, further comprising:
   a separation insulation pattern penetrating an uppermost one of the plurality of gate electrodes,
   wherein the second portion overlaps vertically the separation insulation pattern, and
   wherein the second portion is a portion having a smallest width.

6. The semiconductor device of claim 5, further comprising:
   a plurality of second lower wiring patterns disposed between the substrate and the stack structure,
   wherein the plurality of first lower wiring patterns and the plurality of second lower wiring patterns are connected to each other to constitute a grid structure, and wherein the first portion is connected to one of the plurality of second lower wiring patterns.

7. The semiconductor device of claim 6,
   wherein each of the plurality of second lower wiring patterns extends in the first direction and has a uniform width in the second direction.

8. The semiconductor device of claim 1, further comprising:
   a lower interlayer dielectric layer interposed between the substrate and the stack structure,
   wherein the plurality of first lower wiring patterns penetrates the lower interlayer dielectric layer.

9. The semiconductor device of claim 6, further comprising:
   a plurality of first connecting conductive patterns, each of the plurality of first connecting conductive patterns being disposed between one of the plurality of first lower wiring patterns and the horizontal channel.

10. The semiconductor device of claim 8, further comprising:
    a residual data storage pattern between the lower interlayer dielectric layer and the horizontal channel.

11. The semiconductor device of claim 9, further comprising:
    a plurality of second connecting conductive patterns,
    wherein each of the plurality of second connecting conductive patterns is disposed on one of the plurality of second lower wiring patterns,
    wherein each of the plurality of second connecting conductive patterns is in contact with the horizontal channel.

12. The semiconductor device of claim 11,
    wherein each of the plurality of second connecting conductive patterns has a width greater than a width of the one of the plurality of second lower wiring pattern.

13. The semiconductor device of claim 1, further comprising:
    a data storage pattern disposed between the stack structure and the plurality of vertical channels,
    wherein the data storage pattern is further disposed between the horizontal channel and a bottom surface of the stack structure.

14. A semiconductor device, comprising:
    a lower interlayer dielectric layer on a substrate;
    a plurality of gate electrodes vertically spaced apart from each other and stacked on the lower interlayer dielectric layer;
    a channel structure including a plurality of vertical channels penetrating the plurality of gate electrodes and a horizontal channel connected to a bottom end of each of the plurality of vertical channels; and
    a lower wiring pattern in the lower interlayer dielectric layer and electrically connected to the channel structure,
    wherein the lower wiring pattern comprises:
       a plurality of first lower wiring patterns spaced apart from each other in a first direction, each of the plurality of first lower wiring patterns extending along a second direction crossing the first direction; and
       a plurality of second lower wiring patterns spaced apart from each other in the second direction, each of the plurality of second lower wiring patterns extending along the first direction and running across one of the plurality of first lower wiring patterns to constitute a grid structure,
    wherein each of the plurality of first lower wiring patterns comprises a portion having a width that decreases away from an intersection between one of the plurality of first lower wiring patterns and one of the plurality of second lower wiring patterns.

15. The semiconductor device of claim 14,
    wherein the width of each of the plurality of first lower wiring patterns gradually decreases away from the intersection.

16. The semiconductor device of claim 14,
    wherein the width of each of the plurality of first lower wiring patterns stepwise decreases away from the intersection.

17. The semiconductor device of claim 14, further comprising:

a plurality of first connecting conductive patterns between the plurality of first lower wiring patterns and the horizontal channel; and a plurality of second connecting conductive patterns, wherein each of the plurality of second connecting conductive patterns is disposed on one of the plurality of second lower wiring patterns to be in contact with the horizontal channel and one of the plurality of first connecting conductive patterns.

18. The semiconductor device of claim 14, further comprising:

a data storage pattern disposed between the plurality of gate electrodes and the plurality of vertical channels, wherein the data storage pattern is further disposed between the horizontal channel and a lowermost gate electrode of the plurality of gate electrodes.

19. The semiconductor device of claim 18, further comprising:

a residual data storage pattern between the lower interlayer dielectric layer and the horizontal channel, wherein the residual data storage pattern and the data storage pattern comprises the same thin layer.

20. The semiconductor device of claim 14, further comprising:

a plurality of separation regions extending in the first direction and separating the plurality of gate electrodes from each other in the second direction, wherein the plurality of second lower wiring patterns are provided under the plurality of separation regions.

* * * * *